United States Patent
Miura et al.

(10) Patent No.: US 10,454,386 B2
(45) Date of Patent: Oct. 22, 2019

(54) POWER CONVERSION APPARATUS

(71) Applicant: DENSO CORPORATION, Kariya, Aichi-pref. (JP)

(72) Inventors: Tomoya Miura, Kariya (JP); Yuu Yamahira, Kariya (JP); Kazuma Fukushima, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/090,145

(22) PCT Filed: Mar. 10, 2017

(86) PCT No.: PCT/JP2017/009732
§ 371 (c)(1),
(2) Date: Sep. 28, 2018

(87) PCT Pub. No.: WO2017/169660
PCT Pub. Date: Oct. 5, 2017

(65) Prior Publication Data
US 2019/0123657 A1  Apr. 25, 2019

(30) Foreign Application Priority Data

Mar. 28, 2016 (JP) .................. 2016-063541
Feb. 28, 2017 (JP) .................. 2017-036745

(51) Int. Cl.
| H02M 7/00 | (2006.01) |
| H02M 1/088 | (2006.01) |
| H02P 27/06 | (2006.01) |
| H02M 7/5387 | (2007.01) |
| H01L 23/46 | (2006.01) |

(52) U.S. Cl.
CPC ............ *H02M 7/003* (2013.01); *H02M 1/088* (2013.01); *H02M 7/5387* (2013.01); *H02P 27/06* (2013.01); *H01L 23/46* (2013.01)

(58) Field of Classification Search
CPC .... H02M 7/003; H02M 7/5387; H02M 1/088; H02P 27/06; H01L 23/46
See application file for complete search history.

(56) References Cited

U.S. PATENT DOCUMENTS

2013/0155745 A1* 6/2013 Tanaka .................. H02M 7/003
363/131

FOREIGN PATENT DOCUMENTS

JP  2015-139299 A  7/2015

* cited by examiner

*Primary Examiner* — Adolf D Berhane
*Assistant Examiner* — Afework S Demisse
(74) *Attorney, Agent, or Firm* — Oliff PLC

(57) ABSTRACT

A plurality of semiconductor elements and a control circuit unit are provided. The plurality of semiconductor elements which are connected in parallel are configured to perform switching at the same time. The control circuit unit includes a drive circuit connected to the plurality of semiconductor elements which perform operation at the same time, control wirings and reference wirings. The control wirings connect control electrodes of the semiconductor elements to the drive circuit. The reference wirings connect reference electrodes of the semiconductor elements to the drive circuit. A parasitic inductance in the reference wiring is made smaller than a parasitic inductance in the control wiring.

15 Claims, 40 Drawing Sheets

POWER CONVERSION APPARATUS

CROSS-REFERENCE TO RELATED APPLICATION

The present application is based on and claims the benefit of priority from earlier Japanese Patent Application No. 2016-63541 filed on Mar. 28, 2016, and earlier Japanese Patent Application No. 2017-36745 filed on Feb. 28, 2017, the entire contents of which are incorporated herein by reference.

TECHNICAL FIELD

The present disclosure relates to a power conversion apparatus including a plurality of semiconductor elements and a control circuit unit which controls switching of the semiconductor elements.

BACKGROUND ART

As a power conversion apparatus which performs power conversion between DC power and AC power, a power conversion apparatus including semiconductor elements such as IGBTs and a control circuit unit electrically connected to the semiconductor elements, is known (see the following PTL 1). This power conversion apparatus is configured to convert DC power into AC power by causing the semiconductor elements to perform switching by the above-described control circuit unit.

A drive circuit which drives the semiconductor elements is formed at the control circuit unit. Further, the control circuit unit includes a reference wiring which connects reference electrodes (that is, emitters) of the semiconductor elements to the above-described drive circuit, and a control wiring which connects control electrodes (that is, gates) of the semiconductor elements to the drive circuit. The drive circuit is configured to apply a predetermined control voltage to the control electrodes on the basis of a potential of the above-described reference electrode. By this means, the semiconductor elements are turned on.

In recent years, a power conversion apparatus which is capable of obtaining a higher output current is desired. Connecting a plurality of semiconductor elements in parallel and causing the plurality of semiconductor elements to perform switching at the same time has been studied. Enabling more current to flow through the whole power conversion apparatus even if only a small current can be made to flow through individual semiconductor elements has been studied.

CITATION LIST

Patent Literature

[PTL 1] JP 2015-139299 A

SUMMARY OF THE INVENTION

However, if a plurality of semiconductor elements are caused to perform switching at the same time, voltages applied to control electrodes of the semiconductor elements are likely to vary. That is, in the case where the above-described configuration is employed, one drive circuit is electrically connected to a plurality of semiconductor elements. Further, if a plurality of semiconductor elements are caused to perform switching at the same time, as will be described later, there is a possibility that potentials of the above-described reference electrodes (hereinafter, also referred to as reference potentials) of the semiconductor elements may vary due to variation, or the like, in recovery characteristics of freewheel diodes which are connected in inverse-parallel to the semiconductor elements. Therefore, there is a possibility that a current i flows from a semiconductor element with a higher reference potential to a semiconductor element with a lower reference potential via the above-described reference wiring. In this case, induced electromotive force $\Delta V$ $(=L_{KE}\,di/dt)$ occurs due to a parasitic inductance $L_{KE}$ in the reference wiring.

Therefore, relative to a reference electrode of a semiconductor element with a lower reference potential, a potential which becomes a reference for the drive circuit increases by $\Delta V$ (see FIG. 39). Therefore, a sum $(V_G+\Delta V)$ of a control voltage $V_G$ occurring from the drive circuit and $\Delta V$ is applied to a control electrode of a semiconductor element with a lower reference potential. Therefore, because a voltage higher than a normal control voltage $V_G$ is applied to the control electrode, there can be a possibility that this semiconductor element may degrade.

Further, if the induced electromotive force $\Delta V$ occurs at the reference wiring, relative to a reference electrode of a semiconductor element with a higher reference potential, a potential which becomes a reference for the drive circuit decreases by $\Delta V$ (see FIG. 39). Therefore, only a voltage $V_G - \Delta V$ is applied to a control electrode of a semiconductor element with a higher reference potential. Therefore, this semiconductor element is not correctly turned on, and a current amount is likely to decrease.

The present disclosure is directed to providing a power conversion apparatus which can cause a plurality of semiconductor elements to perform switching at the same time and which can reduce variation in voltages applied to control electrodes of the individual semiconductor elements.

A first aspect of the present disclosure is a power conversion apparatus including: a plurality of semiconductor elements; and a control circuit unit configured to control switching of the semiconductor elements. The semiconductor elements include upper arm semiconductor elements disposed on an upper arm side and lower arm semiconductor elements disposed on a lower arm side, a plurality of the upper arm semiconductor elements which are connected in parallel to each other being caused to perform switching at the same time, and a plurality of the lower arm semiconductor elements which are connected in parallel to each other being caused to perform switching at the same time, by the control circuit unit. The control circuit unit includes a drive circuit respectively electrically connected to the plurality of semiconductor elements which perform switching at the same time, control wirings which connect control electrodes of the semiconductor elements to the drive circuit, and reference wirings which connect reference electrodes of the semiconductor elements to the drive circuit. A parasitic inductance in the reference wiring is made smaller than a parasitic inductance in the control wiring.

In the power conversion apparatus, the parasitic inductance in the reference wiring is made smaller than the parasitic inductance in the control wiring.

It is therefore possible to reduce variation in voltages applied to the control electrodes of the individual semiconductor elements. That is, as described above, if the plurality of semiconductor elements connected in parallel to each other are caused to perform switching at the same time, reference potentials of the individual semiconductor elements are likely to vary. As a result, it may occur that a current flows from a semiconductor element with a higher reference potential to a semiconductor element with a lower reference potential via the reference wiring. However, in the present aspect, because the parasitic inductance in the reference wiring is made smaller, it is possible to make induced electromotive force $\Delta V$ which occurs at the reference wiring when a current flows smaller. As described above, while $V_G+\Delta V$ is applied to a control electrode of a semiconductor element with a lower reference potential, and $V_G-\Delta V$ is applied to a semiconductor element with a higher reference potential, because it is possible to make $\Delta V$ smaller in the present aspect, it is possible to suppress variation in voltages applied to the control electrodes of the respective semiconductor elements. Therefore, it is possible to suppress defects such as degradation of semiconductor elements as a result of an excessively high voltage being applied to a control electrode of the semiconductor element with a lower reference potential and failure of semiconductor elements to be correctly turned on as a result of only a low voltage being applied to a control electrode of the semiconductor element with a higher reference potential.

As described above, according to the present aspect, it is possible to provide a power conversion apparatus which can cause a plurality of semiconductor elements to perform switching at the same time and which can reduce variation in voltages applied to control electrodes of individual semiconductor elements.

BRIEF DESCRIPTION OF DRAWINGS

The above and other objects, features and advantages of the present disclosure will become clearer from the following detailed description with reference to the accompanying drawings, in which.

DESCRIPTION OF EMBODIMENTS

The above-described power conversion apparatus can be made an in-vehicle power conversion apparatus to be mounted on a vehicle such as an electric car and a hybrid car.
(First Embodiment)

A present embodiment relating to the above-described power conversion apparatus will be described using FIG. 1 to FIG. 7. As illustrated in FIG. 4, a power conversion apparatus 1 in the present embodiment includes a plurality of semiconductor elements 2 and a control circuit unit 3. The semiconductor elements 2 include upper arm semiconductor elements $2_H$ disposed on an upper arm side and lower arm semiconductor elements $2_L$ disposed on a lower arm side. A plurality of upper arm semiconductor elements $2_H$ connected in parallel to each other are caused to perform switching at the same time by the control circuit unit 3. Further, a plurality of lower arm semiconductor elements $2_L$ connected in parallel to each other are caused to perform switching at the same time by the control circuit unit 3.

Figure 1:
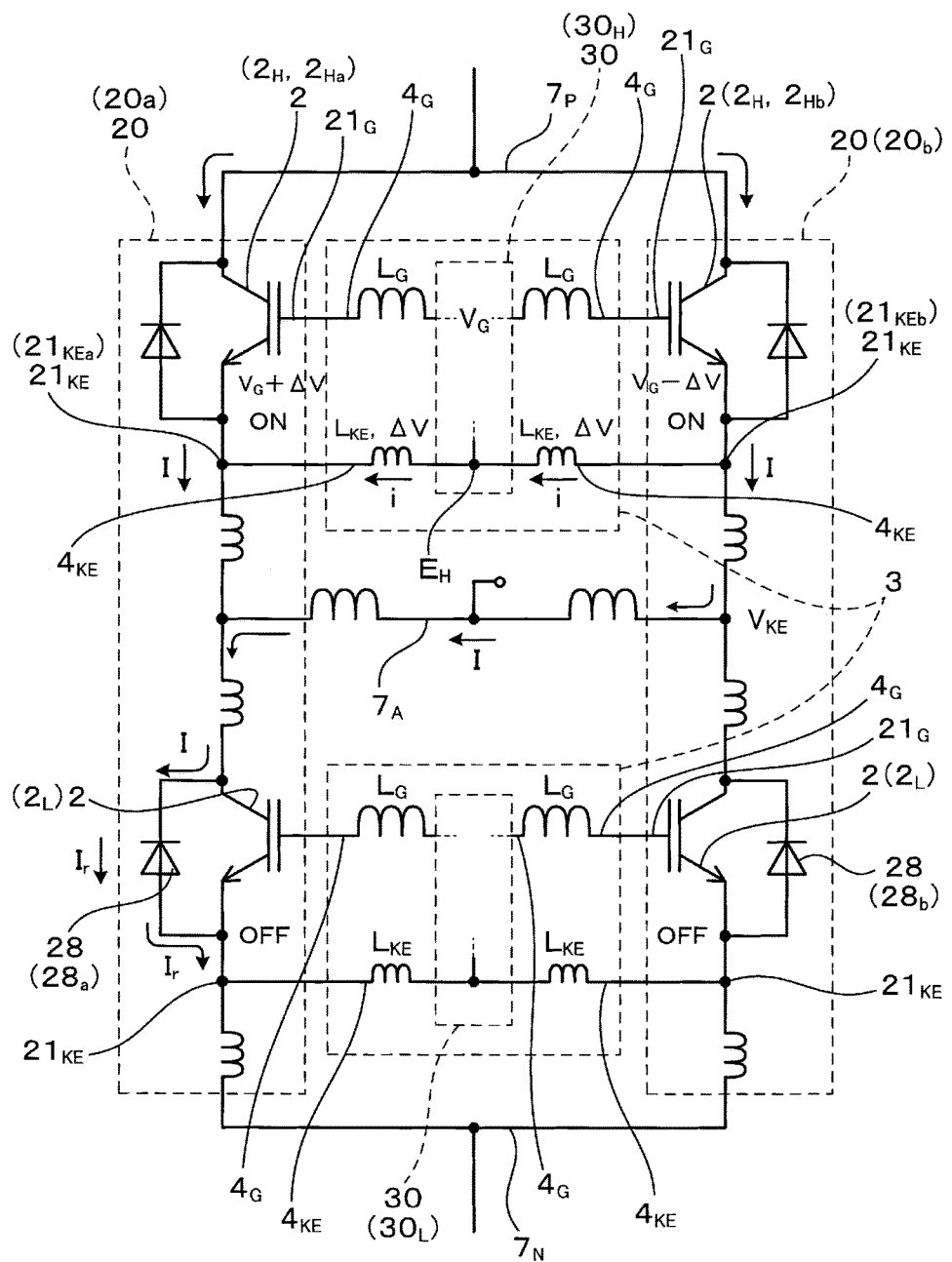
FIG. 1 is a circuit diagram of part of a power conversion apparatus when upper arm semiconductor elements are turned on in a first embodiment.

As illustrated in FIG. 1, the control circuit unit 3 includes a drive circuit 30 connected to the plurality of semiconductor elements 2 which perform switching at the same time, a control wiring $4_G$ and a reference wiring $4_{KE}$. The control wiring $4_G$ electrically connects control electrodes $21_G$ (that is, gates) of the semiconductor elements 2 to the drive circuit 30. Further, the reference wiring $4_{KE}$ electrically connects reference electrodes $21_{KE}$ (that is, emitters) of the semiconductor elements 2 to the drive circuit 30.

A parasitic inductance $L_{KE}$ in the reference wiring $4_{KE}$ is made smaller than a parasitic inductance $L_G$ in the control wiring $4_G$.

The power conversion apparatus 1 in the present embodiment is an in-vehicle power conversion apparatus to be mounted on a vehicle such as an electric car and a hybrid car. As illustrated in FIG. 4, in the present embodiment, two upper arm semiconductor elements $2_H$ and two lower arm semiconductor elements $2_L$ are connected in parallel. The semiconductor elements 2 in the present embodiment are IGBTs. The semiconductor elements 2 are incorporated into a semiconductor module 2 (see FIG. 7). The upper arm semiconductor elements $2_H$ and the lower arm semiconductor elements $2_L$ are incorporated into one semiconductor module 20.

The semiconductor module 20 includes a semiconductor module $20_u$ for a U phase, a semiconductor module $20_v$ for a V phase, and a semiconductor module $20_w$ for a W phase. By the semiconductor elements 2 within the semiconductor module 20 being caused to perform switching by the control circuit unit 3, DC power supplied from a DC power supply 8 is converted into AC power. Then, a three-phase AC motor 81 is driven using this AC power to cause the above-described vehicle to travel.

Figure 7:
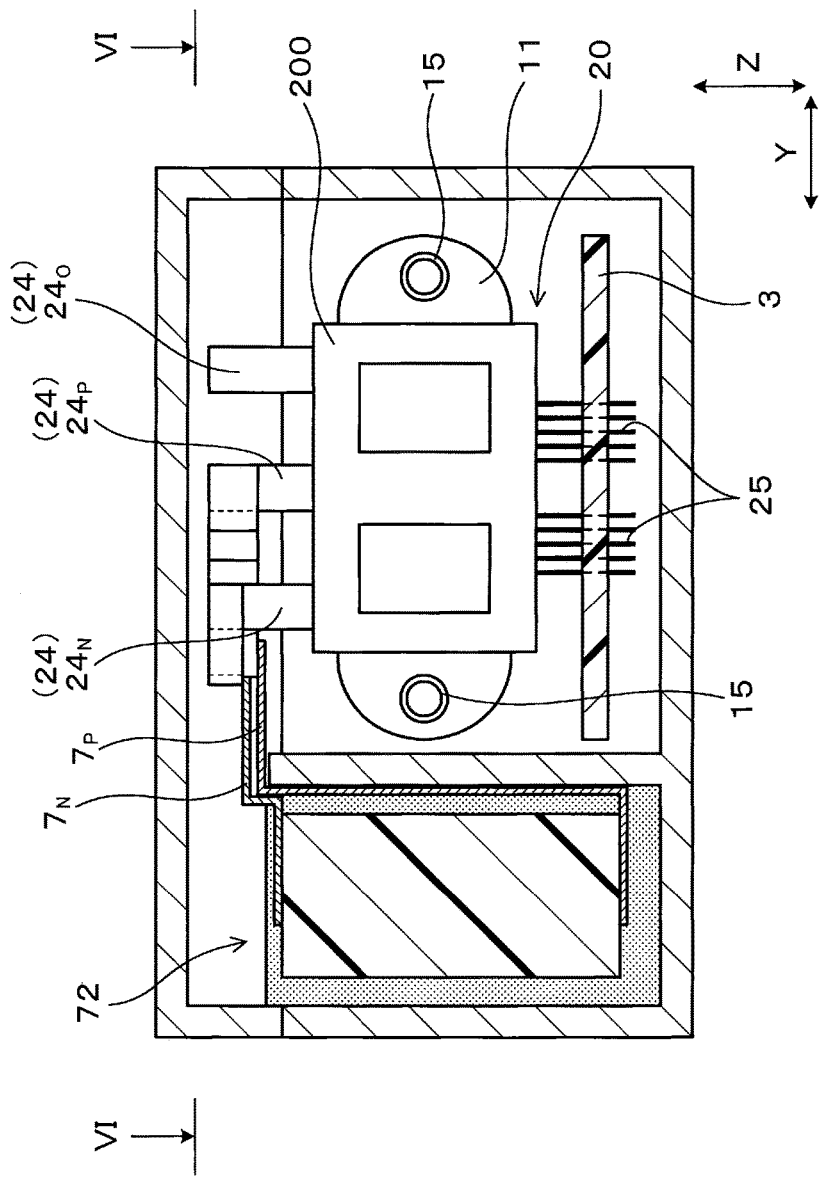
FIG. 7 is a cross-section diagram along VII-VII in FIG. 6.

As illustrated in FIG. 7, the semiconductor module 20 includes a body member 200 into which the semiconductor elements 2 are incorporated, power terminals 24 projecting from the body member 200, and control terminals 25. The power terminals 24 include a positive terminal $24_P$ and a negative terminal $24_N$ to which DC voltages are applied, and an output terminal $24_O$ which outputs AC power. The above-described control terminals 25 are connected to the control circuit unit 3.

Figure 5:
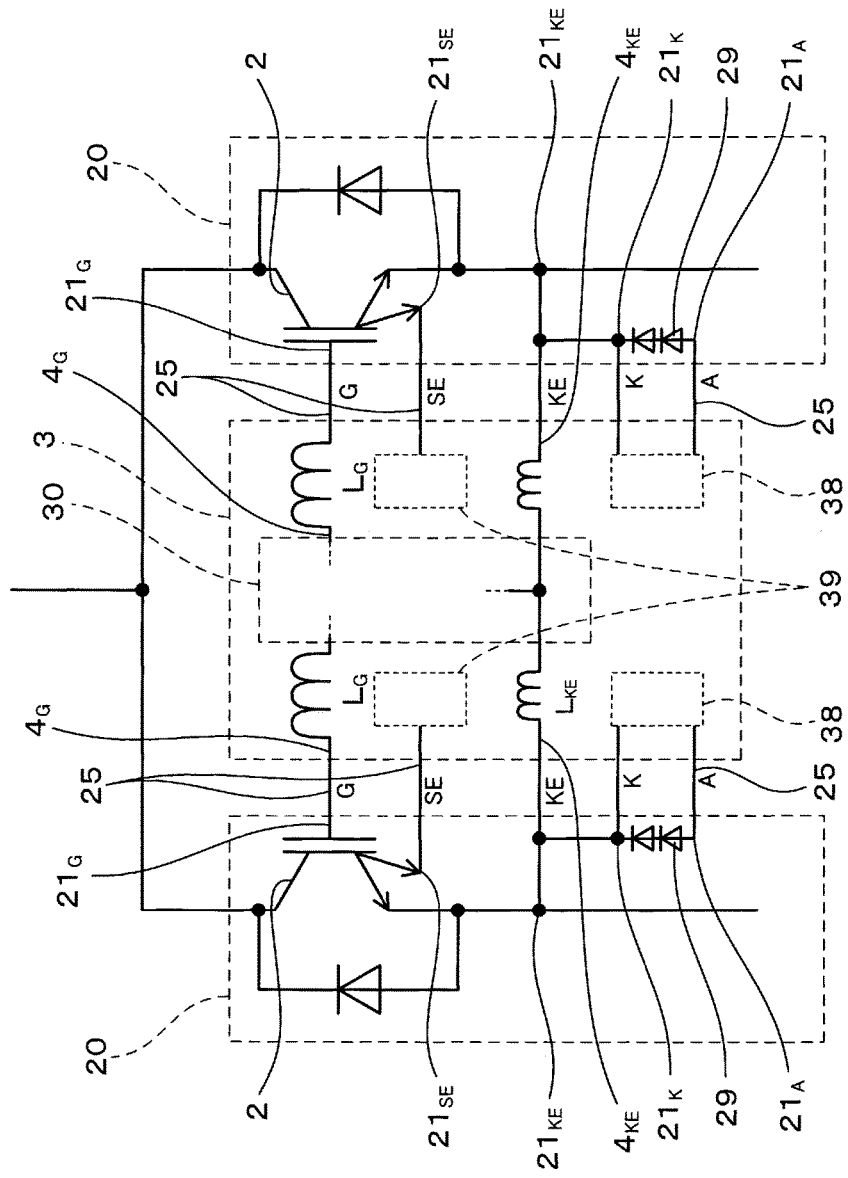
FIG. 5 is a more detailed circuit diagram of the upper arm semiconductor elements and the control circuit unit in the first embodiment.

As illustrated in FIG. 5, the semiconductor element 2 includes a sense electrode $21_{SE}$ in addition to the above-described control electrode $21_G$ and reference electrode $21_{KE}$. Further, a temperature sensitive diode 29 is incorporated into the semiconductor module 20. A cathode electrode $21_K$ of the temperature sensitive diode 29 is connected to the reference electrode $21_{KE}$. An anode electrode $21_A$ and the cathode electrode $21_K$ of the temperature sensitive diode 29, and electrodes $21_G$, $21_{KE}$ and $21_{SE}$ of the semiconductor element 2 are electrically connected to the control circuit unit 3 via the control terminals 25. The anode electrode $21_A$ and the cathode electrode $21_K$ are connected to a temperature detection circuit 38, and the sense electrode $21_{SE}$ is connected to a current detection circuit 39. The temperature detection circuit 38 measures a temperature of the semiconductor element 2 by measuring a forward voltage of the temperature sensitive diode 29. Further, the current detection circuit 39 measures a current flowing through the whole semiconductor element 2 by measuring a current flowing through the sense electrode $21_{SE}$.

Figure 3:
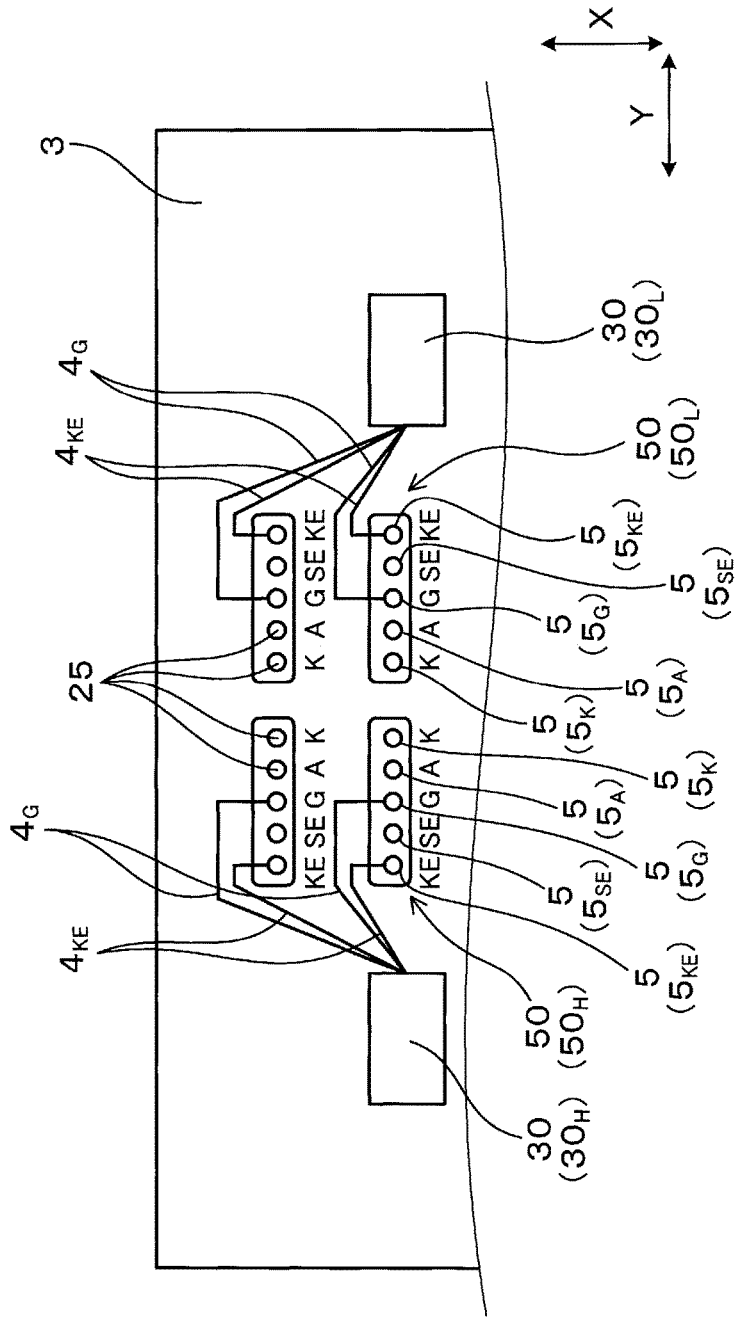
FIG. 3 is a plan view of part of a control circuit unit in the first embodiment.
Figure 4:
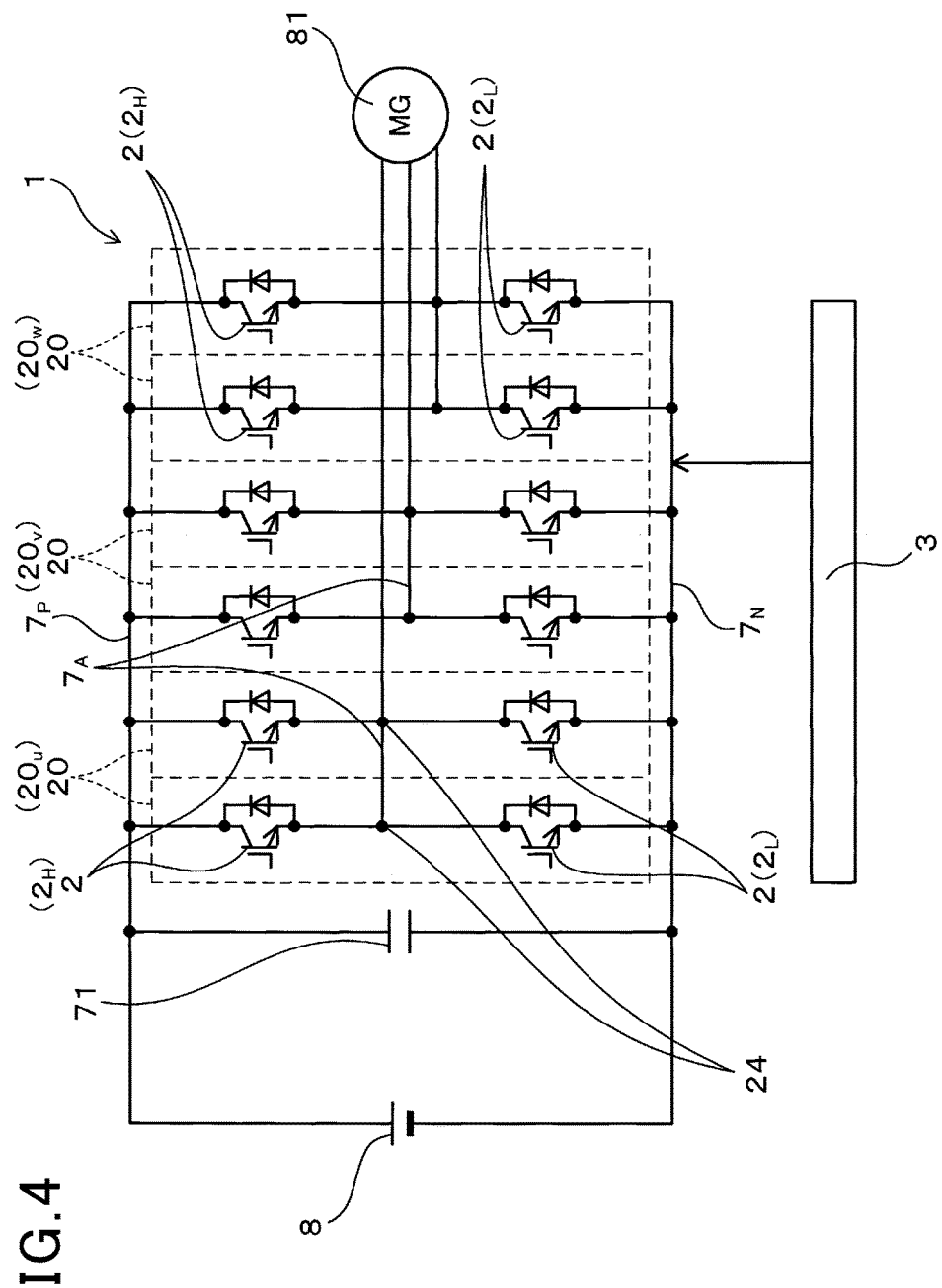
FIG. 4 is a summary circuit diagram of the power conversion apparatus in the first embodiment.

As illustrated in FIG. 3, a plurality of connecting member 5 (in the present embodiment, through-holes) for electrically connecting the control circuit unit 3 to the semiconductor elements 2 are formed at the control circuit unit 3. The control terminals 25 are inserted into and soldered at the connecting members 5. The control circuit unit 3 includes a reference connecting member $5_{KE}$ for connecting to the reference electrode $21_{KE}$, a control connecting member $5_G$ for connecting to the control electrode $21_G$ and a sense connecting member $5_{SE}$ for connecting to the sense electrode $21_{SE}$, as the connecting members 5. Further, the control circuit unit 3 includes an anode connecting member $5_A$ for connecting to the anode electrode $21_A$, and a cathode connecting member $5_K$ for connecting to the cathode electrode $21_K$. The drive circuit 30 is connected to the reference connecting member $5_{KE}$ with the reference wiring $4_{KE}$. The drive circuit 30 is connected to the control connecting member $5_G$ with the control wiring $4_G$. In the present embodiment, a wiring length of the reference wiring $4_{KE}$ is made shorter than a wiring length of the control wiring $4_G$. By this means, the parasitic inductance $L_{KE}$ in the reference wiring $4_{KE}$ is made smaller than the parasitic inductance $L_G$ in the control wiring $4_G$.

A reason why a difference occurs in voltages applied to the control electrodes $21_G$ of the respective semiconductor elements 2 in the case where the plurality of semiconductor elements 2 are caused to perform switching at the same time will be described next. As illustrated in FIG. 1, reference electrodes $21_{KE}$ of two upper arm semiconductor elements $2_H$ are electrically connected with an AC bus bar $7_A$. An inductance is parasitic in the AC bus bar $7_A$. Further, freewheel diodes 28 are connected in inverse parallel to the individual semiconductor elements 2.

Here, a case will be considered where a state is switched from a state where both the upper arm semiconductor elements $2_H$ and the lower arm semiconductor elements $2_L$ are turned off to a state where the upper arm semiconductor elements $2_H$ are turned on. Immediately before the upper arm semiconductor elements $2_H$ are turned on, a reflux current (not illustrated) flows through the freewheel diodes 28 of the lower arm semiconductor elements $2_L$ in a forward direction due to the inductance of the three-phase AC motor 81 (see FIG. 4). When the upper arm semiconductor elements $2_H$ are turned on, a current I flows, and the reflux current gradually decreases. Then, the freewheel diodes 28 are recovered, and a recovery current $I_r$ flows.

Here, it may occur that while one freewheel diode $28_a$ recovers quickly, the other freewheel diode $28_b$ does not recover so quickly, due to a difference of recovery characteristics between two freewheel diodes $28_a$ and $28_b$. In this situation, currents I of the two upper arm semiconductor elements $2_H$ both flow through one freewheel diode $28_a$. Therefore, a current I which flows through the other upper arm semiconductor element $2_{Hb}$ passes through the AC bus bar $7_A$ and flows through one freewheel diode $28_a$. As described above, because an inductance is parasitic in the AC bus bar $7_A$, induced electromotive force $V_{KE}$ occurs due to this inductance. Therefore, a potential of the reference electrode $21_{KEb}$ of one upper arm semiconductor element $2_{Hb}$ becomes higher than a potential of the reference electrode $21_{KEa}$ of the other upper arm semiconductor element $2_{Ha}$ by $V_{KE}$.

Therefore, a current i flows from the upper arm semiconductor element $2_{Hb}$ with a higher reference potential to the upper arm semiconductor element $2_{Ha}$ with a lower reference potential through the reference wiring $4_{KE}$. Therefore, induced electromotive force $\Delta V$ ($=L_{KE}$ di/dt) occurs by the parasitic inductance $L_{KE}$ in the reference wiring $4_{KE}$. Therefore, a potential $E_H$ which becomes a reference for the drive circuit 30 becomes higher by $\Delta V$ with respect to the reference electrode $21_{KEa}$ of the semiconductor element $2_{Ha}$ with a lower reference potential. The drive circuit 30 applies a control voltage $V_G$ to the control electrode $21_G$ on the basis of the potential $E_H$. Therefore, a sum $V_G+\Delta V$ of the control voltage $V_G$ and $\Delta V$ is applied to the control electrode $21_G$ of the semiconductor element $2_{Ha}$ with a lower reference potential.

Further, when induced electromotive force $\Delta V$ occurs, a potential $E_H$ which becomes a reference for the drive circuit 30 becomes lower by $\Delta V$ with respect to the reference electrode $21_{KEb}$ of the semiconductor element $2_{Hb}$ with a higher reference potential. Therefore, only $V_G-\Delta V$ is applied to the control electrode $21_G$ of the semiconductor element $2_{Hb}$ with a higher reference potential. In this manner, in the case where the plurality of semiconductor elements 2 are caused to perform switching at the same time, voltages applied to the control electrode $21_G$ are likely to vary. However, in the present embodiment, as described above, because the parasitic inductance $L_{KE}$ in the reference wiring $4_{KE}$ is made smaller, it is possible to make the induced electromotive force $\Delta V$ smaller. It is therefore possible to prevent great variation in voltages applied to the control electrodes $21_G$.

Figure 2:
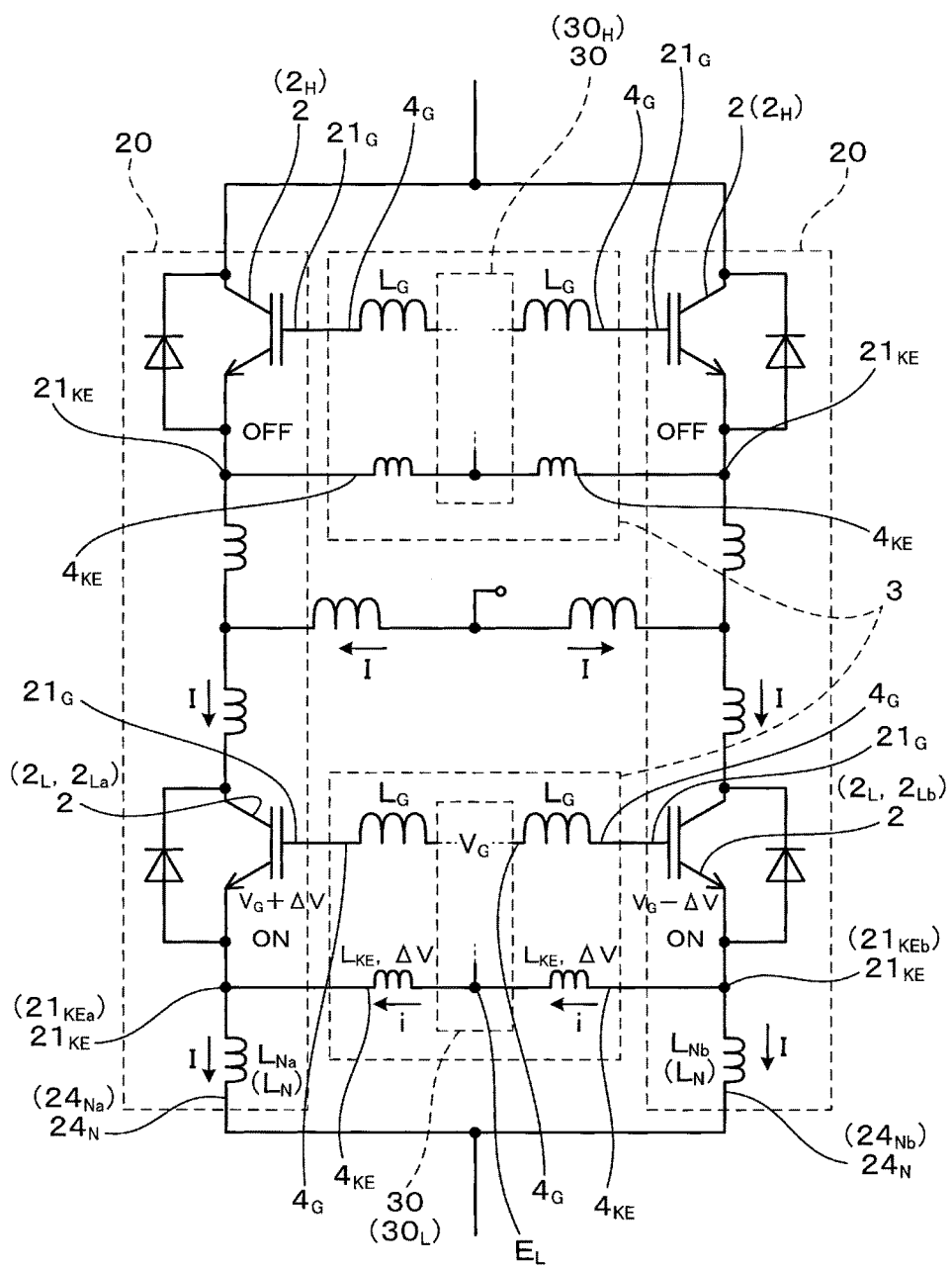
FIG. 2 is a circuit diagram of part of a power conversion apparatus when lower arm semiconductor elements are turned on in the first embodiment.

Meanwhile, also when the lower arm semiconductor elements $2_L$ are turned on, in a similar manner, it may occur that a difference occurs in voltages applied to the control electrodes $21_G$. As illustrated in FIG. 2, the negative terminals $24_N$ of the semiconductor modules 20 are connected to the lower arm semiconductor elements $2_L$. Inductances $L_N$ are parasitic in the negative terminals $24_N$. There is a case where the inductances $L_N$ of two negative terminals $24_N$ are different from each other. For example, it may occur that a parasitic inductance $L_{Nb}$ in one negative terminal $24_{Nb}$ is higher than a parasitic inductance Lyra in the other negative terminal $24_{Na}$. In this situation, if the two lower arm semiconductor elements $2_{La}$ and $2_{Lb}$ are both turned on, a current I flows through the negative terminals $24_{Na}$ and $24_{Nb}$, and a difference occurs in the induced electromotive force which occurs at the negative terminals $24_{Na}$ and $24_{Nb}$ by a difference of the inductances. Therefore, a potential of the reference electrode $21_{KEb}$ of one lower arm semiconductor element $2_{Lb}$ becomes higher than a potential of the reference electrode $21_{KEa}$ of the other lower arm semiconductor element $2_{La}$.

Therefore, a current I flows from one lower arm semiconductor element $2_{Lb}$ to the other lower arm semiconductor element $2_{La}$ through the reference wiring $4_{KE}$. Therefore, in a similar manner to a case where the upper arm semiconductor elements $2_H$ are turned on (see FIG. 1), a difference occurs in voltages applied to the control electrodes $21_G$. That is, while $V_G+\Delta V$ is applied to the control electrode $21_G$ of one lower arm semiconductor element $2_{La}$, only $V_G-\Delta V$ is applied to the control electrode $21_G$ of the other lower arm semiconductor element $2_{Lb}$. However, in the present embodiment, as described above, the parasitic inductance $L_{KE}$ in the reference wiring $4_{KE}$ is made smaller. Therefore, it is possible to prevent great variations in voltages applied to the control electrodes $21_G$.

Figure 6:
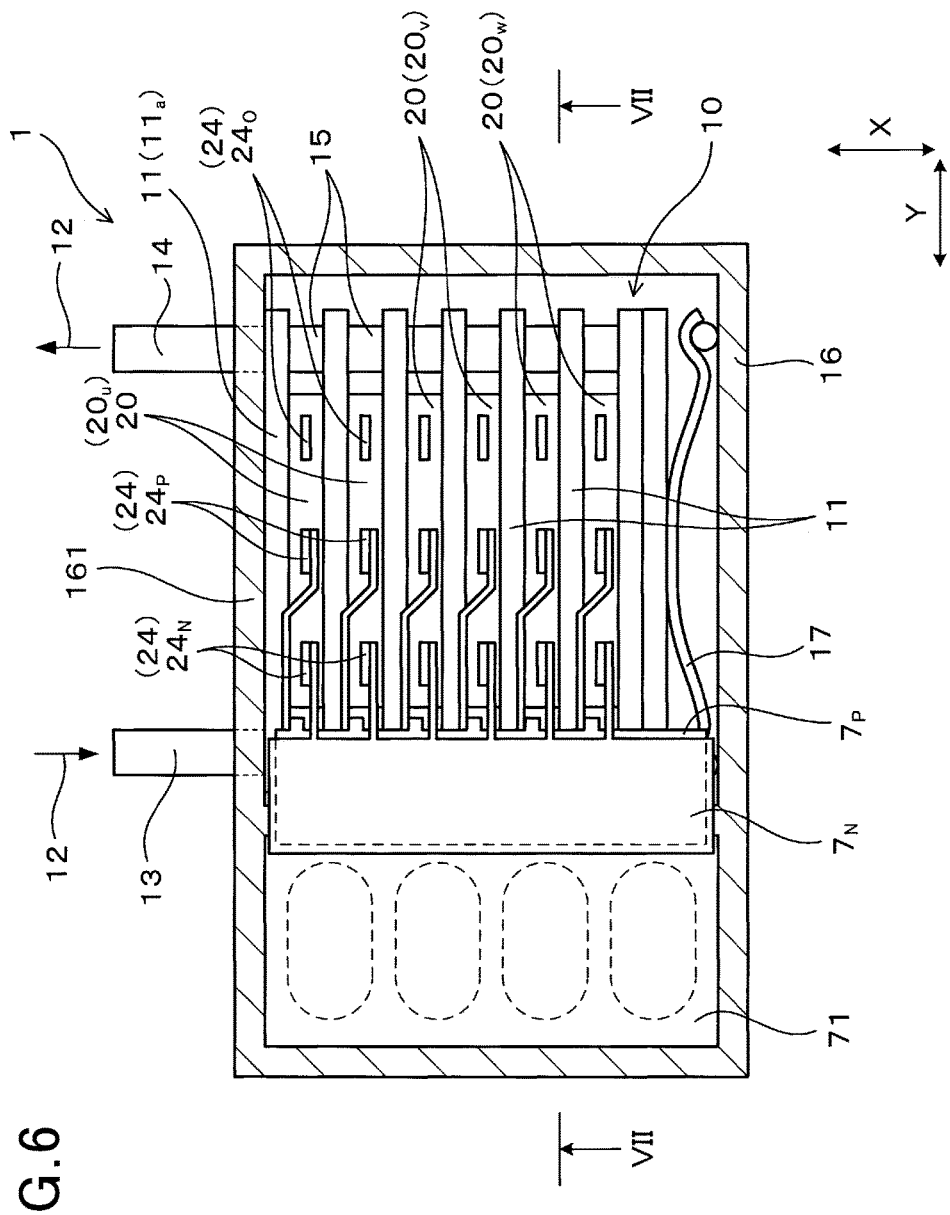
FIG. 6 is a cross-section diagram of the power conversion apparatus in the first embodiment which is a cross-section diagram along VI-VI in FIG. 7.

A structure of the power conversion apparatus 1 will be described next. As illustrated in FIG. 6 and FIG. 7, in the present embodiment, the semiconductor modules 20 and cooling tubes 11 are alternately laminated to constitute a laminated body 10. A pressure member 17 (for example, a leaf spring) is disposed at a position adjacent to the laminated body 10 in a laminating direction (hereinafter, also referred to as an X direction) of the laminated body 10. A pressure is applied to the laminated body 10 toward a wall member 161 of a chassis 16 by the pressure member 17. By this means, the laminated body 10 is fixed inside the chassis 16 while a contact pressure between the semiconductor modules 20 and the cooling tubes 11 is secured.

The two cooling tubes 11 adjacent in the X direction are connected to each other with a connecting tube 15. Further, an inlet tube 13 for introducing a refrigerant 12 and an outlet tube 14 for discharging the refrigerant 12 are connected to an end portion cooling tube $11_a$ located at one end in the X direction among a plurality of cooling tubes 11. If the refrigerant 12 is introduced from the inlet tube 13, the refrigerant 12 passes through the connecting tube 15 and flows through all the cooling tubes 11. By this means, the semiconductor modules 20 are cooled.

Further, as described above, the semiconductor module 20 includes a positive terminal $24_P$, a negative terminal $24_N$, an output terminal $24_O$ and control terminals 25. The positive terminal $24_P$ is connected to a capacitor 72 with a positive bus bar $7_P$. Further, the negative terminal $24_N$ is connected to the capacitor 72 with a negative bus bar $7_N$.

As illustrated in FIG. 3, the control terminals 25 are connected to the connecting members 5 of the control circuit unit 3. A connecting member group 50 is configured with a plurality of connecting members 5. The drive circuits 30 are formed at positions adjacent to the connecting member groups 50 in a direction the plurality of connecting members 5 are arranged (hereinafter, also referred to as a Y direction). Further, as described above, the control circuit unit 3 includes the reference connecting members $5_{KE}$ and the control connecting members $5_G$ as the connecting members 5. The drive circuits 30 are connected to the reference connecting members $5_{KE}$ with the reference wiring $4_{KE}$. The drive circuits 30 are connected to the control connecting members $5_G$ with the control wiring $4_G$. In the Y direction, the reference connecting members $5_{KE}$ are formed at positions closer to the drive circuits 30 to which the reference connecting members $5_{KE}$ and the control connecting members $5_G$ are connected, than the control connecting members $5_G$ are. More specifically, among the plurality of connecting members 5, connecting members 5 formed at positions closest to the drive circuits 30 in the Y direction are set as the reference connecting members $5_{KE}$.

As illustrated in FIG. 3, the connecting member group 50 includes an upper arm connecting member group $50_H$ for connecting to the upper arm semiconductor elements $2_H$ and a lower arm connecting member group $50_L$ for connecting to the lower arm semiconductor elements $2_L$. The upper arm connecting member group $50_H$ and the lower arm connecting member group $50_L$ are adjacent to each other in the Y direction. Further, the drive circuit 30 includes an upper arm drive circuit $30_H$ connected to the upper arm semiconductor elements $2_H$, and a lower arm drive circuit $30_L$ connected to the lower arm semiconductor elements $2_L$. The upper arm drive circuit $30_H$ and the lower arm drive circuit $30_L$ are formed at positions such that the upper arm connecting member group $50_H$ and the lower arm connecting member group $50_L$ are put between the upper arm drive circuit $30_H$ and the lower arm drive circuit $30_L$ in the Y direction.

Operational effects of the present embodiment will be described. As illustrated in FIG. 1 and FIG. 2, in the present embodiment, the parasitic inductance $L_{KE}$ in the reference wiring $4_{KE}$ is made smaller than the parasitic inductance $L_G$ in the control wiring $4_G$.

It is therefore possible to reduce variation in voltages applied to the control electrodes $21_G$ of the individual semiconductor elements 2. That is, as described above, if the plurality of semiconductor elements 2 connected in parallel are caused to perform switching at the same time, reference potentials of the individual semiconductor elements 2 are likely to vary. As a result, it may occur that a current i flows from the semiconductor element 2 with a higher reference potential to the semiconductor element 2 with a lower reference potential via the reference wiring $4_{KE}$. However, in the present embodiment, because the parasitic inductance $L_{KE}$ in the reference wiring $4_{KE}$ is made smaller, it is possible to make induced electromotive force $\Delta V$ occurring at the reference wiring $4_{KE}$ smaller. While $V_G+\Delta V$ is applied to the control electrode $21_G$ of the semiconductor element 2 with a lower reference potential, and $V_G-\Delta V$ is applied to the semiconductor element 2 with a higher reference potential, because $\Delta V$ can be made smaller in the present embodiment, it is possible to suppress variation in voltages applied to the control electrodes $21_G$ of the respective semiconductor elements 2. It is therefore possible to suppress defects such as degradation of semiconductor elements 2 as a result of an excessively high voltage being applied to the control electrode $21_G$ of the semiconductor element 2 with a lower reference potential and failure of semiconductor elements 2 to be correctly turned on as a result of only a low voltage being applied to the control electrode $21_G$ of the semiconductor element 2 with a higher reference potential.

Figure 39:
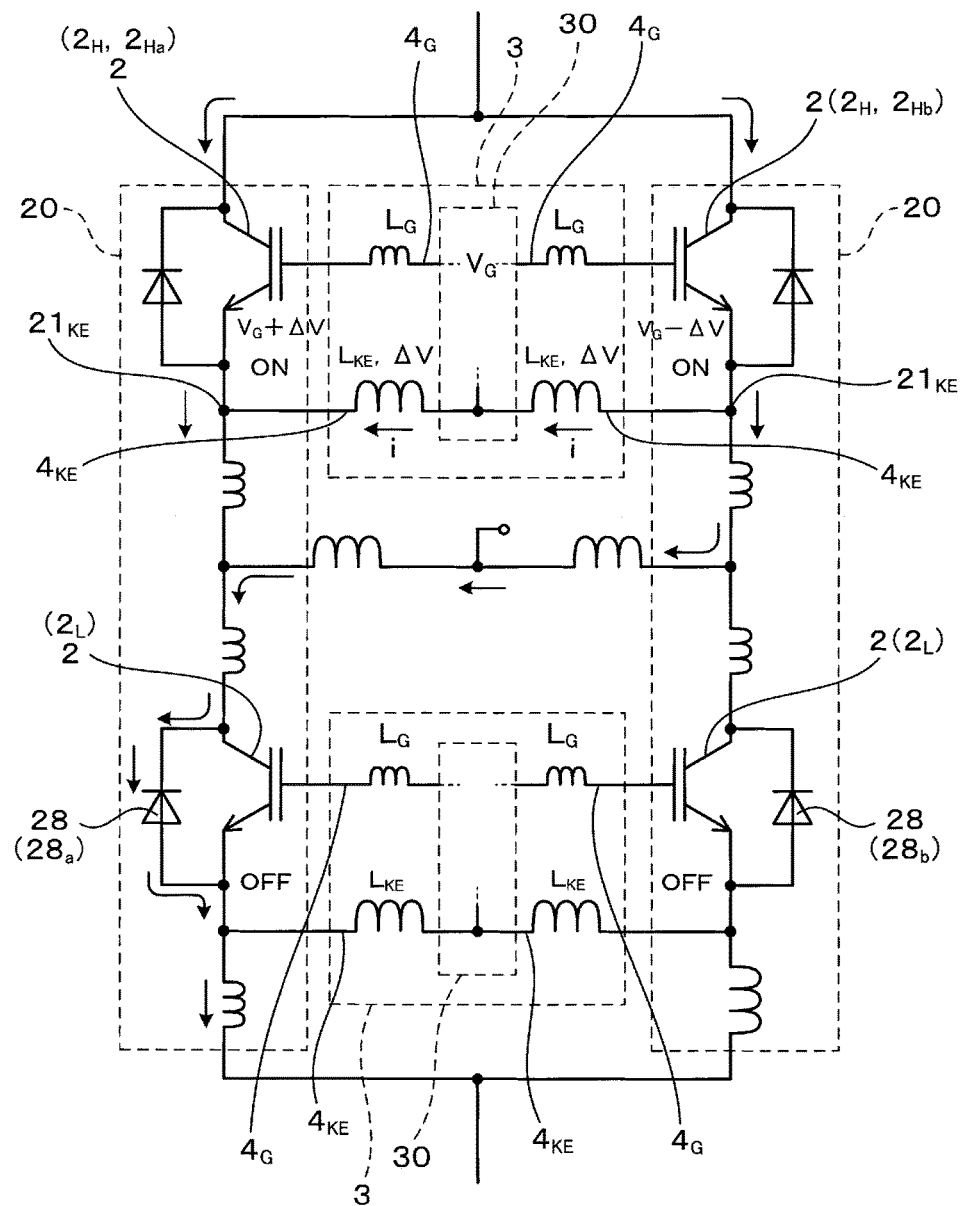
FIG. 39 is a circuit diagram of part of a power conversion apparatus when upper arm semiconductor elements are turned on in a comparative embodiment.
Figure 40:
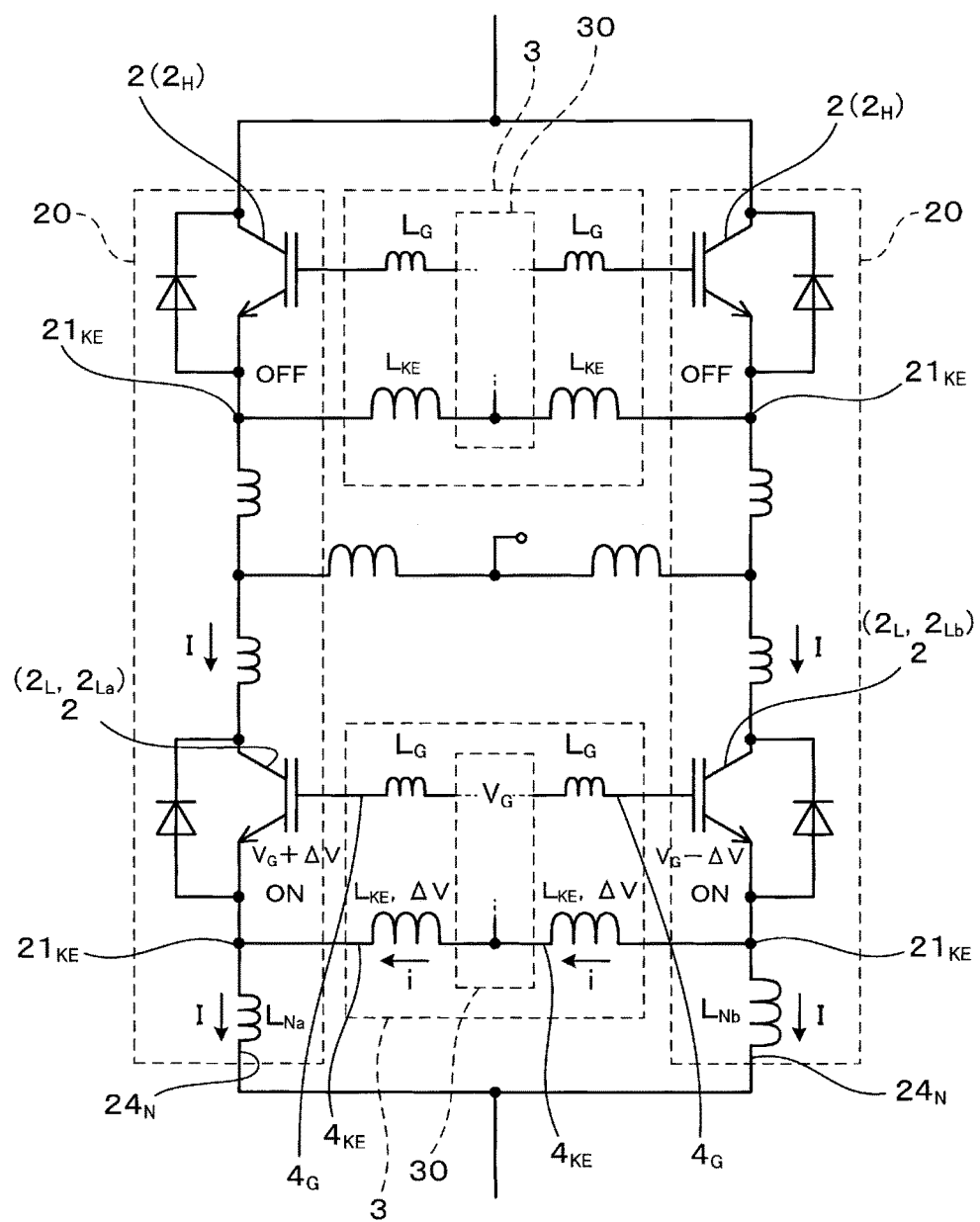
FIG. 40 is a circuit diagram of part of a power conversion apparatus when lower arm semiconductor elements are turned on in the comparative embodiment.

In the conventional power conversion apparatus 1, as illustrated in FIG. 39, the parasitic inductance $L_{KE}$ in the reference wiring $4_{KE}$ is larger than the parasitic inductance $L_G$ in the control wiring $4_G$. Therefore, when a current i flows through the reference wiring $4_{KE}$, high induced electromotive force $\Delta V$ occurs. Therefore, when a plurality of upper arm semiconductor elements $2_H$ are turned on at the same time, problems occur that an upper arm semiconductor element $2_{Ha}$ which is part of the upper arm semiconductor elements $2_H$ is likely to degrade as a result of a high voltage $V_G+\Delta V$ being applied to the upper arm semiconductor element $2_{Ha}$, and that other upper arm semiconductor element $2_{Hb}$ is not correctly turned on as a result of only a low voltage $V_G-\Delta V$ being applied to the upper semiconductor element $2_{Hb}$. Further, as illustrated in FIG. 40, also in the case where a plurality of lower arm semiconductor elements $2_{La}$ and $2_{Lb}$ are turned on at the same time, similar problems occur. In contrast to this, in the present embodiment, because the inductance $L_{KE}$ of the reference wiring $4_{KE}$ is made smaller, it is possible to make $\Delta V$ smaller. It is therefore possible to make variation in voltages applied to the control electrode $21_G$ of the individual semiconductor elements 2 smaller.

Further, in the present embodiment, as illustrated in FIG. 3, a wiring length of the reference wiring $4_{KE}$ is made shorter than a wiring length of the control wiring $4_G$.

It is therefore possible to certainly make the parasitic inductance $L_{KE}$ in the reference wiring $4_{KE}$ smaller than the parasitic inductance $L_G$ in the control wiring $4_G$.

Further, in the present embodiment, a plurality of connecting members 5 are formed at the control circuit unit 3. The drive circuits 30 are formed at positions adjacent to the connecting member groups 50 in the Y direction. The reference connecting members $5_{KE}$ are formed at positions closer to the drive circuits 30 than the control connecting members $5_G$ in the Y direction are.

Therefore, it is possible to shorten a length of the reference wiring $4_{KE}$ which connects the drive circuits 30 to the reference connecting members $5_{KE}$, so that it is possible to make the parasitic inductance $L_{KE}$ in the reference wiring $4_{KE}$ smaller.

Further, as illustrated in FIG. 3, in the present embodiment, among the plurality of connecting members 5, connecting members 5 which are formed at positions closest to the drive circuits 30 in the Y direction are set as the reference connecting members $5_{KE}$.

It is therefore possible to further shorten a length of the reference wiring $4_{KE}$, so that it is possible to effectively reduce the inductance of the reference wiring $4_{KE}$.

Further, as illustrated in FIG. 1 and FIG. 2, in the present embodiment, the upper arm semiconductor elements $2_H$ and the lower arm semiconductor elements $2_L$ are incorporated into the same semiconductor module 20.

Figure 12:
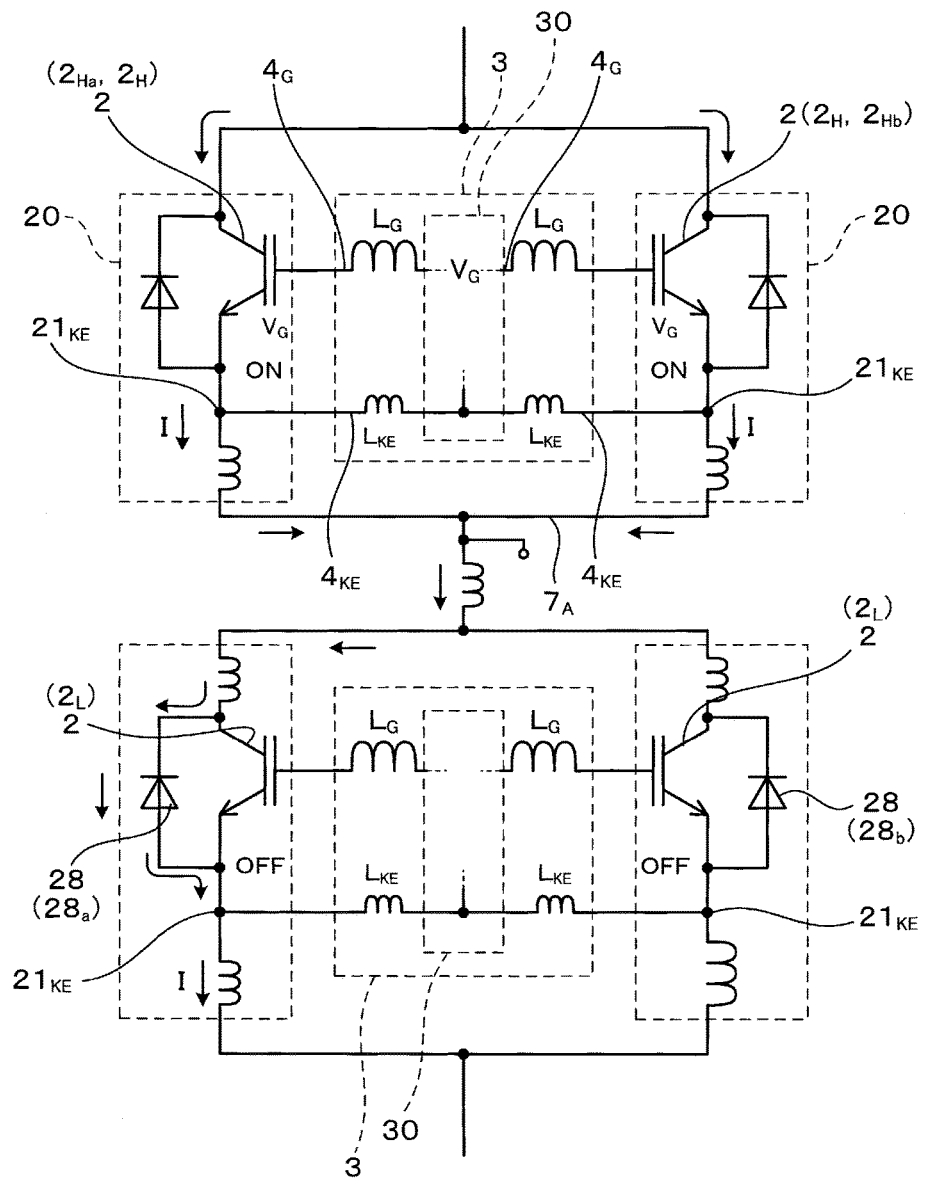
FIG. 12 is a circuit diagram of part of a power conversion apparatus when upper arm semiconductor elements are turned on in a sixth embodiment.

It is therefore possible to exert effects of the present invention particularly prominently. That is, as illustrated in FIG. 12, it is also possible to incorporate the upper arm semiconductor elements $2_H$ and the lower arm semiconductor elements $2_L$ into different semiconductor modules 20, in which case voltages applied to the control electrodes $21_G$ of the upper arm semiconductor elements $2_H$ are less likely to vary greatly. That is, in this case, the two upper arm semiconductor elements $2_H$ are not respectively individually connected to the lower arm semiconductor elements $2_L$, and are electrically connected to the lower arm semiconductor elements $2_L$ only via a common AC bus bar $7_A$. Therefore, in the case where only one freewheel diode $28_a$ is recovered, and the other freewheel diode $28_b$ is not recovered, currents I which respectively flow through the two upper arm semiconductor elements $2_H$ both pass through the AC bus bar $7_A$ and flow through one freewheel diode $28_a$. Therefore, because the both currents I pass through the AC bus bar $7_A$, levels of the parasitic inductances in current paths become substantially the same, and levels of induced electromotive force occurring due to the inductances become substantially the same. Therefore, potentials of the reference electrodes $21_{KE}$ of the two upper arm semiconductor elements $2_{Ha}$ and $2_{Hb}$ become substantially equal to each other. Therefore, a large current i does not flow through the reference wiring $4_{KE}$, and there occurs little induced electromotive force $\Delta V$ at the reference wiring $4_{KE}$. Therefore, voltages applied to the control electrodes $21_G$ of the two upper arm semiconductor elements $2_{Ha}$ and $2_{Hb}$ become substantially equal to each other.

In contrast to this, as illustrated in FIG. 1, as in the present embodiment, in the case where the upper arm semiconductor elements $2_H$ and the lower arm semiconductor elements $2_L$ are incorporated into the same semiconductor module 20, the upper arm semiconductor elements $2_H$ are individually connected to the lower arm semiconductor elements $2_L$ inside the semiconductor module 20. Therefore, in the case where only one freewheel diode $28_a$ is recovered, a current I of one upper arm semiconductor element $2_{Ha}$ does not pass through the AC bus bar $7_A$, and only a current I of the other upper arm semiconductor element $2_{Hb}$ passes through the AC bus bar $7_A$. Therefore, a great difference occurs in the parasitic inductances in the current paths, which becomes a cause of making reference potentials of the two upper arm semiconductor elements $2_{Ha}$ and $2_{Hb}$ greatly different from each other. Therefore, a current i flows through the reference wiring $4_{KE}$, and induced electromotive force $\Delta V$ is likely to occur at the reference wiring $4_{KE}$. Therefore, as in the present embodiment, in the case where the upper arm semiconductor elements $2_H$ and the lower arm semiconductor elements $2_L$ are incorporated into the same semiconductor module 20, by making the parasitic inductance $L_{KE}$ in the reference wiring $4_{KE}$ smaller, it is possible to exert an effect of suppressing variation in voltages applied to the control electrodes $21_G$ of the upper arm semiconductor elements $2_H$ particularly prominently.

As described above, according to the present embodiment, it is possible to provide a power conversion apparatus 10 which can cause a plurality of semiconductor elements to perform switching at the same time and which can reduce variation in voltages applied to control electrodes of the individual semiconductor elements.

Note that, while, in the present embodiment, the inductance $L_{KE}$ of the reference wiring $4_{KE}$ is made smaller than the inductance $L_G$ of the control wiring $4_G$ on both the upper arm side and on the lower arm side, the present invention is not limited to this. That is, it is also possible to make the inductance $L_{KE}$ of the reference wiring $4_{KE}$ smaller than the inductance $L_G$ of the control wiring $4_G$ on only one of the upper arm side and the lower arm side.

In the following embodiments, among reference numerals used in the drawings, reference numerals which are the same as those used in the first embodiment indicate components, or the like, similar to those in the first embodiment unless otherwise specified.

(Second Embodiment)

Figure 8:
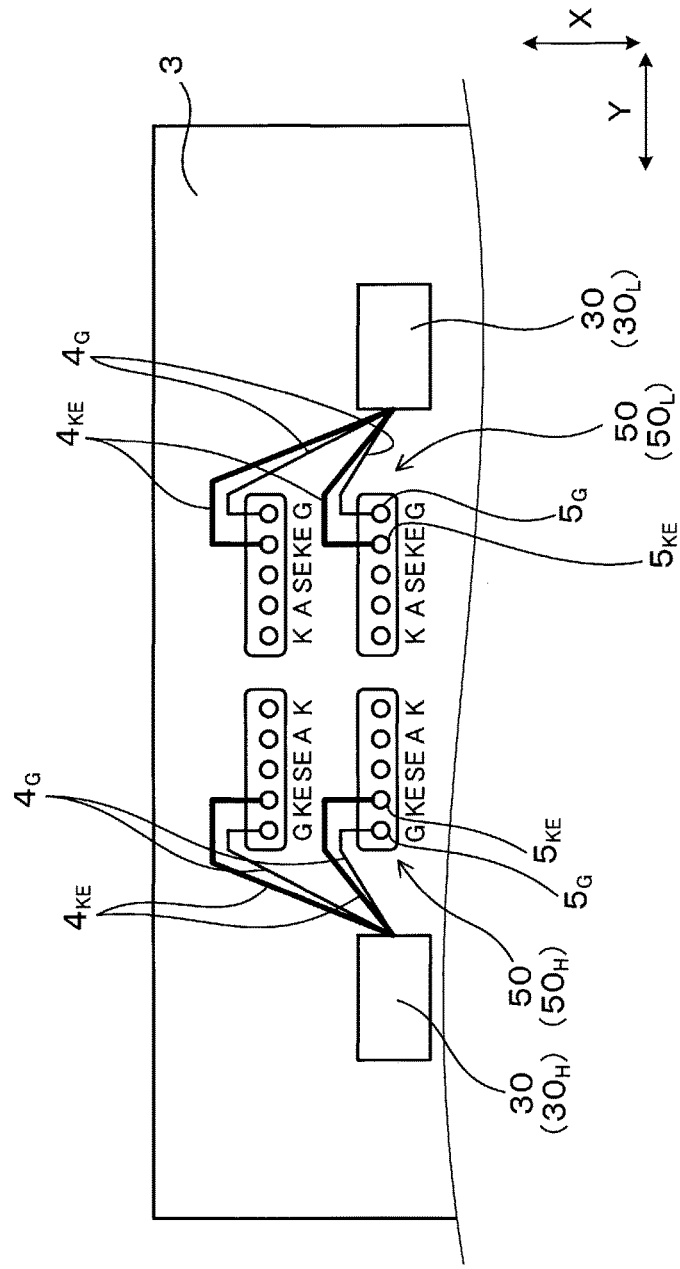
FIG. 8 is a plan view of part of a control circuit unit in a second embodiment.

The present embodiment is an example in which a configuration of the control circuit unit 3 is changed. As illustrated in FIG. 8, in the present embodiment, a width of the reference wiring $4_{KE}$ is made thicker than a width of the control wiring $4_G$. By this means, the parasitic inductance $L_{KE}$ in the reference wiring $4_{KE}$ is made smaller than the parasitic inductance $L_G$ in the control wiring $4_G$.

By this means, even in the case where the control connecting members $5_G$ are formed at positions closer to the drive circuits 30 than the reference connecting members $5_{KE}$ are, it is possible to make the inductance $L_{KE}$ of the reference wiring $4_{KE}$ smaller than the inductance $L_G$ of the control wiring $4_G$.

The second embodiment has a configuration and operational effects similar to those in the first embodiment for other points.

Note that, while, in the present embodiment, the control wiring $4_G$ is made shorter than the reference wiring $4_{KE}$, the present invention is not limited to this. That is, as in the first embodiment (see FIG. 3), it is also possible to make the reference wiring $4_{KE}$ shorter than the control wiring $4_G$ and further make the width of the reference wiring $4_{KE}$ thicker than the width of the control wiring $4_G$. By this means, because a wiring length of the reference wiring $4_{KE}$ can be made shorter and the width of the reference wiring $4_{KE}$ can be made thicker, it is possible to effectively make the inductance $L_{KE}$ of the reference wiring $4_{KE}$ smaller.

(Third Embodiment)

Figure 9:
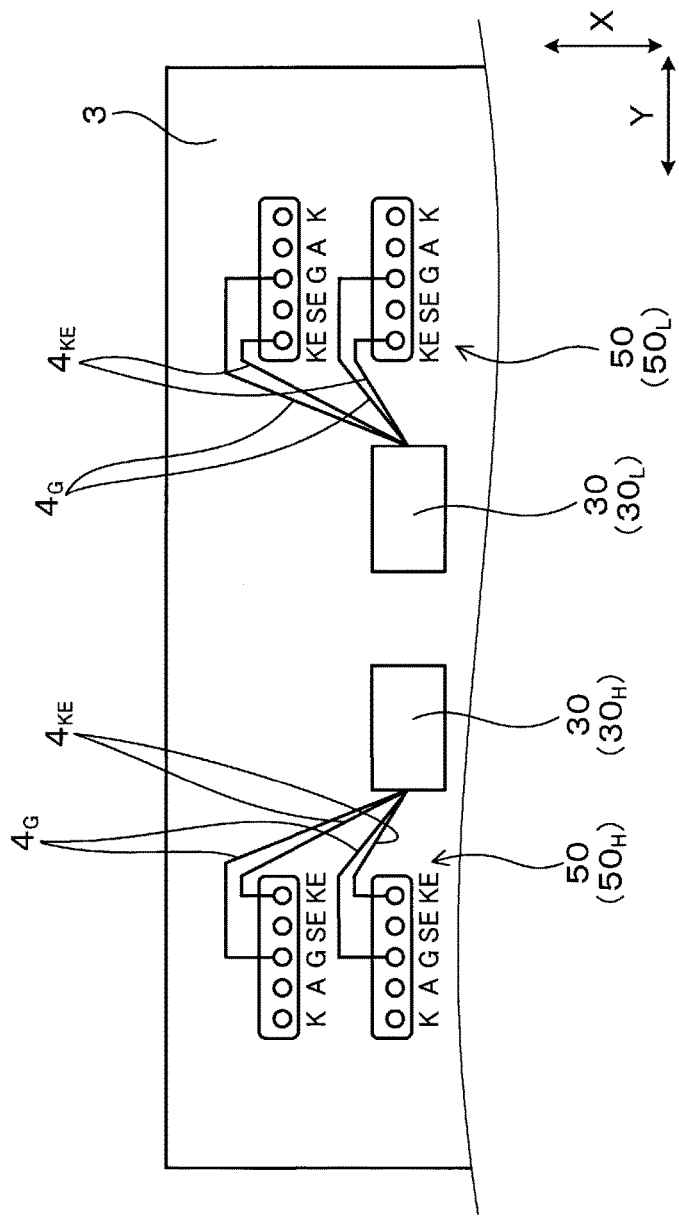
FIG. 9 is a plan view of part of a control circuit unit in a third embodiment.

The present embodiment is an example in which the configuration of the control circuit unit 3 is changed. As illustrated in FIG. 9, in the present embodiment, two drive circuits $30_H$ and $30_L$ are formed between the upper arm connecting member group $50_H$ and the lower arm connecting member group $50_L$. The individual drive circuits $30_H$ and $30_L$ are formed at positions adjacent to the connecting member groups 50 in the Y direction.

The third embodiment has a configuration and operational effects similar to those in the first embodiment for other points.

(Fourth Embodiment)

Figure 10:
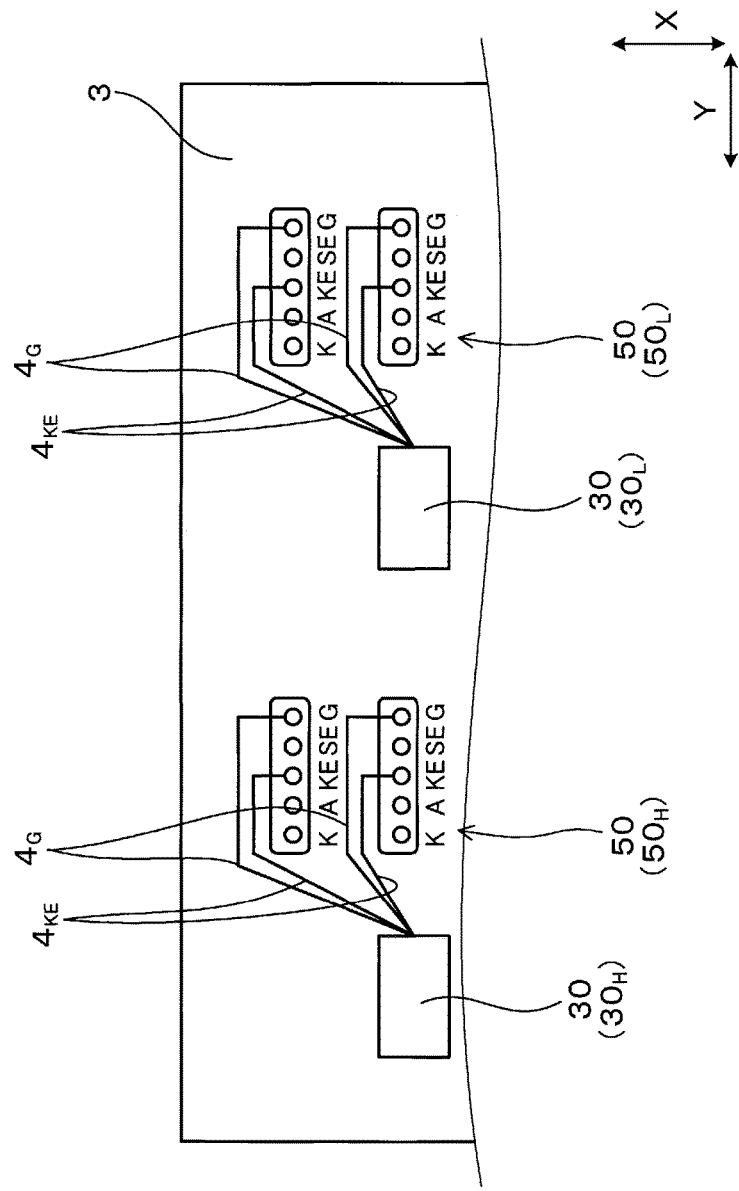
FIG. 10 is a plan view of part of a control circuit unit in a fourth embodiment.

The present embodiment is an example in which the configuration of the control circuit unit 3 is changed. As illustrated in FIG. 10, in the present embodiment, the individual drive circuits $30_H$ and $30_L$ are disposed on one side of the connecting member groups 50 in the Y direction. That is, the upper arm drive circuit $30_H$ is disposed on one side of the upper arm connecting member group $50_H$ in the Y direction, and the lower arm drive circuit $30_L$ is disposed on one side of the lower arm connecting member group $50_L$ in the Y direction.

The fourth embodiment has a configuration and operational effects similar to those in the first embodiment for other points.

(Fifth Embodiment)

Figure 11:
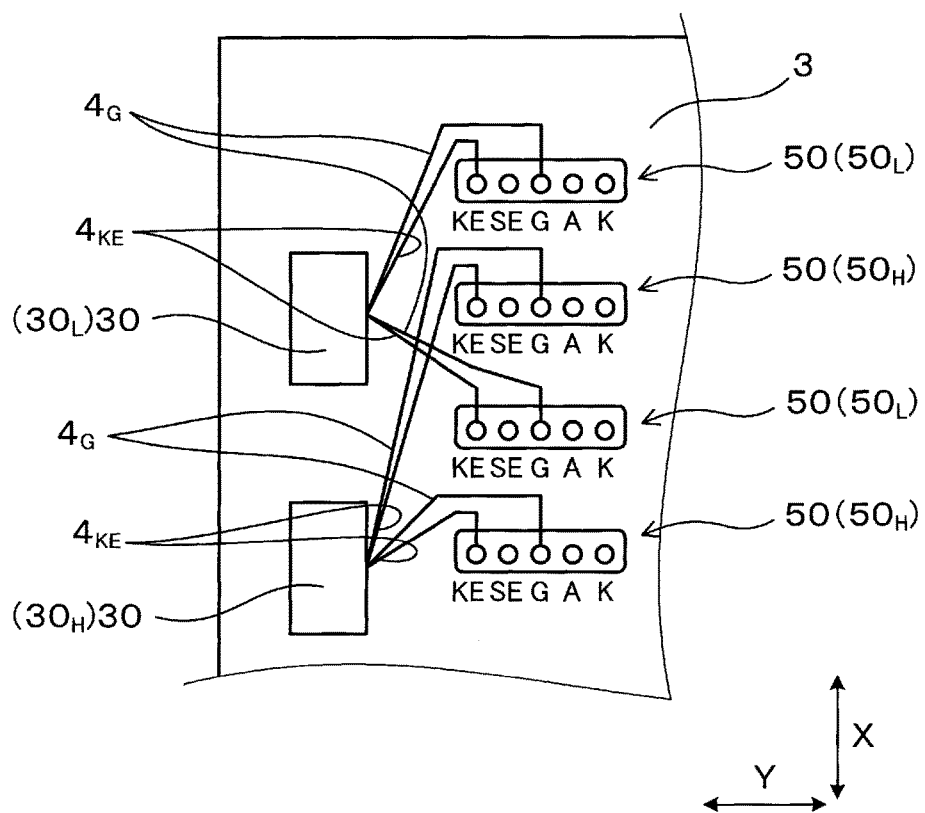
FIG. 11 is a plan view of part of a control circuit unit in a fifth embodiment.

The present embodiment is an example in which the configuration of the control circuit unit 3 is changed. As illustrated in FIG. 11, in the present embodiment, the upper arm connecting member groups $50_H$ and the lower arm connecting member groups $50_L$ are alternately disposed in the X direction. The drive circuits $30_H$ and $30_L$ are disposed on one side of the connecting member groups $50_H$ and $50_L$ in the Y direction. Further, in the present embodiment, in a similar manner to the first embodiment, the reference wiring $4_{KE}$ is made shorter than the control wiring $4_G$. By this means, the parasitic inductance $L_{KE}$ in the reference wiring $4_{KE}$ is made smaller than the parasitic inductance $L_G$ in the control wiring $4_G$.

The fifth embodiment has a configuration and operational effects similar to those in the first embodiment for other points.

(Sixth Embodiment)

Figure 13:
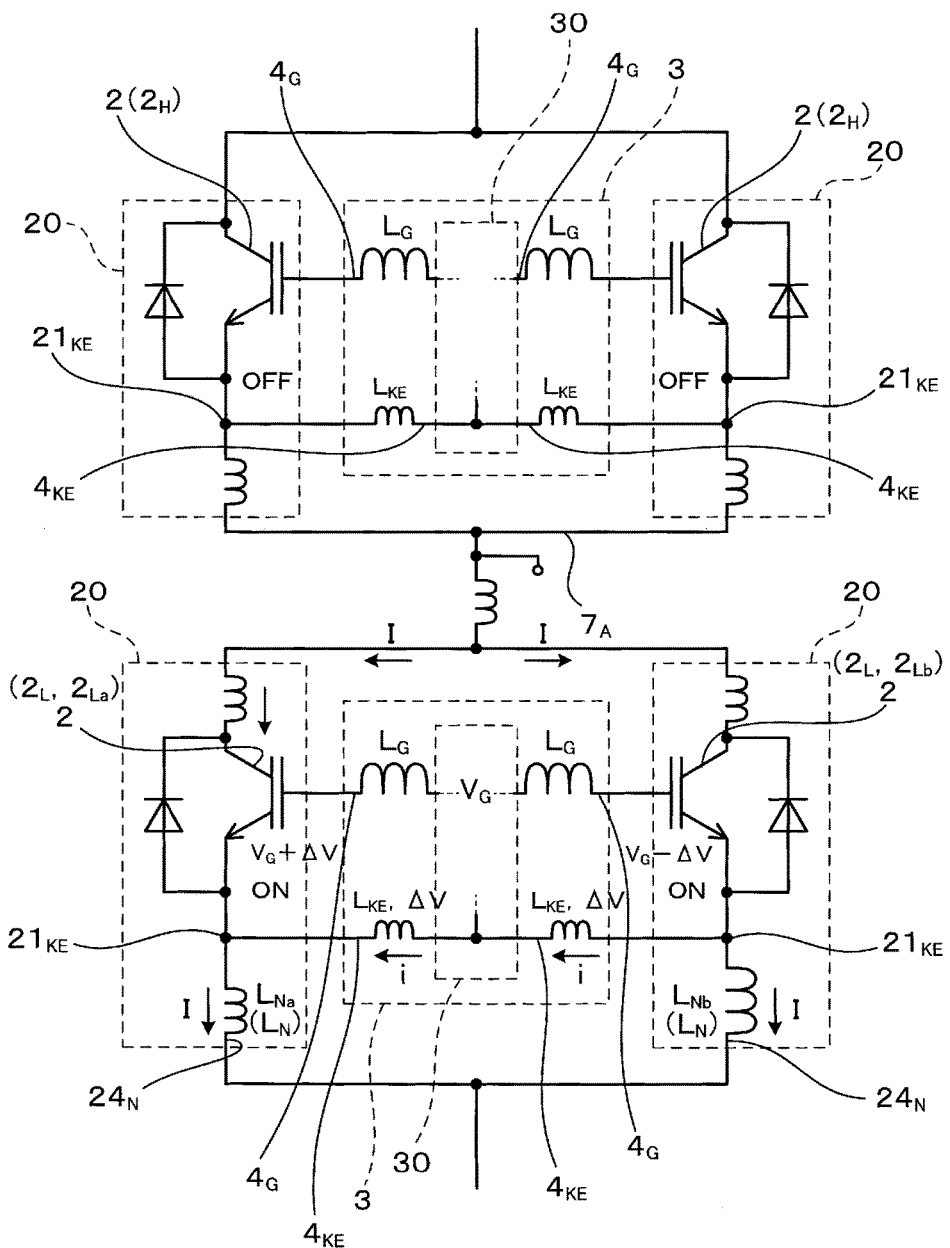
FIG. 13 is a circuit diagram of part of the power conversion apparatus when lower arm semiconductor elements are turned on in the sixth embodiment.

The present embodiment is an example in which a configuration of the semiconductor module 20 is changed. As illustrated in FIG. 12 and FIG. 13, in the present embodiment, the upper arm semiconductor elements $2_H$ and the lower arm semiconductor elements $2_L$ are incorporated into different semiconductor modules 20. In this case, as described above, while a difference is less likely to occur in potentials of the reference electrodes $21_{KE}$ of a plurality of upper arm semiconductor elements $2_H$ (see FIG. 12), there is a case where a difference occurs in potentials of the reference electrodes $21_{KE}$ of the lower arm semiconductor elements $2_L$. That is, negative terminals $24_N$ are connected to the reference electrodes $21_{KE}$ of the lower arm semiconductor elements $2_L$, and it may occur that the inductances $L_{Nb}$ of the negative terminals $24_N$ vary. For example, it may occur that the inductance $L_{Nb}$ of one lower arm semiconductor element $2_{Lb}$ is larger than the inductance $L_{Na}$ of the other lower arm semiconductor element $2_{La}$. In this situation, if the two lower arm semiconductor elements $2_{La}$ and $2_{Lb}$ are turned on at the same time, a potential of the reference electrode $21_{KE}$ of one lower arm semiconductor element $2_{Lb}$ becomes higher than a potential of the other lower arm semiconductor element $2_{La}$ by a difference between the inductances $L_{Na}$ and $L_{Nb}$. Therefore, a current i passes through the reference wiring $4_{KE}$ and flows from one lower arm semiconductor element $2_{Lb}$ to the other lower arm semiconductor element $2_{La}$, and induced electromotive force $\Delta V$ occurs at the reference wiring $4_{KE}$. However, in the present embodiment, because the parasitic inductance $L_{KE}$ in the reference wiring $4_{KE}$ is made smaller, it is possible to make $\Delta V$ smaller. It is therefore possible to prevent voltages applied to the respective semiconductor elements $2_{La}$ and $2_{Lb}$ from varying.

The sixth embodiment has a configuration and operational effects similar to those in the first embodiment for other points.

(Seventh Embodiment)

Figure 14:
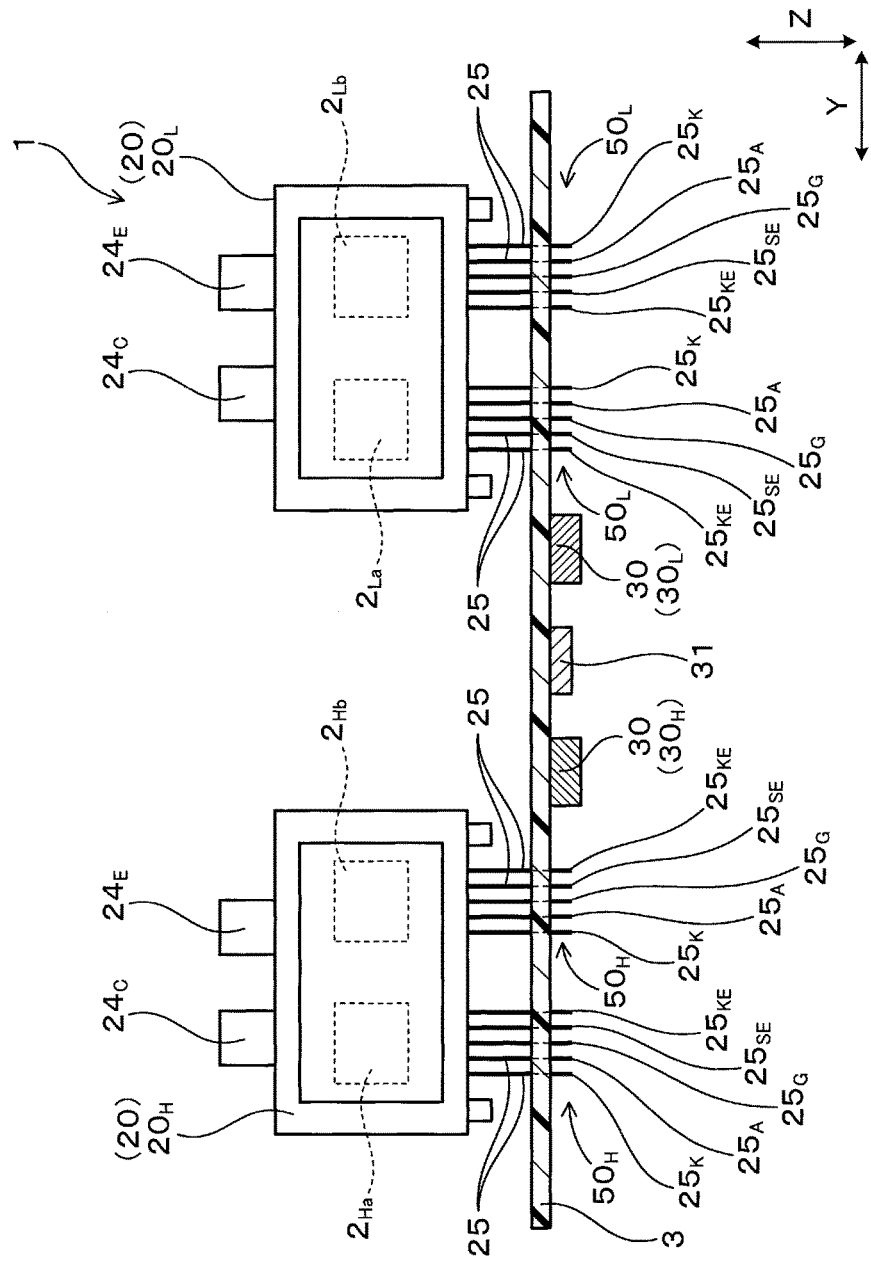
FIG. 14 is a schematic cross-section diagram of a power conversion apparatus in a seventh embodiment.
Figure 16:
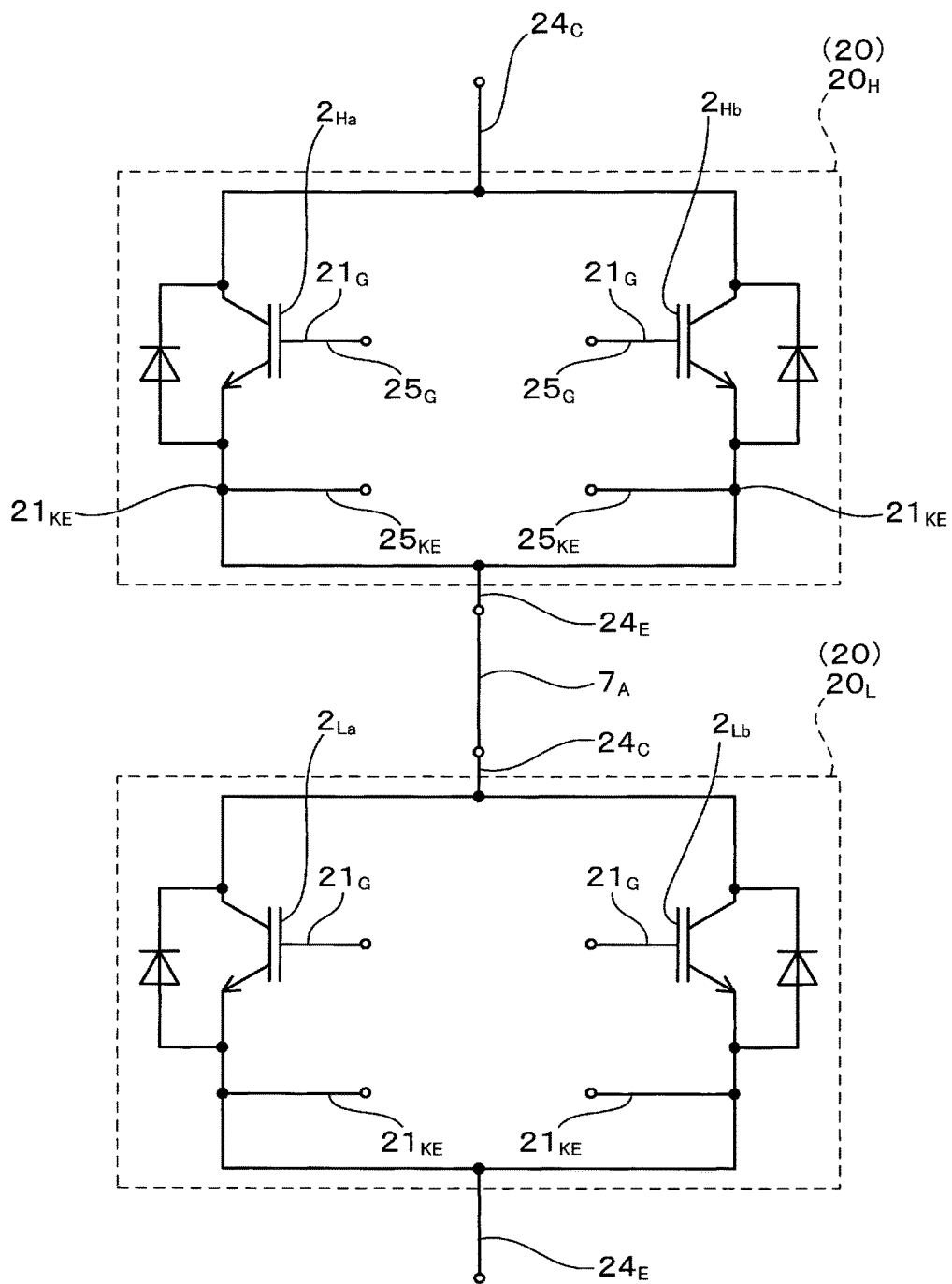
FIG. 16 is a conceptual diagram of a semiconductor module in the seventh embodiment.

The present embodiment is an example in which a position where the control circuit unit 30 is disposed, or the like, is changed. As illustrated in FIG. 14, in the present embodiment, the upper arm semiconductor elements $2_H$ and the lower arm semiconductor elements $2_L$ are provided in different semiconductor modules 20 ($20_H$ and $20_L$). Further, as illustrated in FIG. 14 and FIG. 16, a plurality of upper arm semiconductor elements $2_H$ ($2_{Ha}$ and $2_{Hb}$) which are connected in parallel to each other and which perform switching at the same time are incorporated into the upper arm semiconductor module $20_H$ of the present embodiment. In a similar manner, a plurality of lower arm semiconductor elements $2_L$ ($2_{La}$ and $2_{Lb}$) which are connected in parallel to each other and which perform switching at the same time are incorporated into the lower arm semiconductor module $20_L$.

Figure 15:
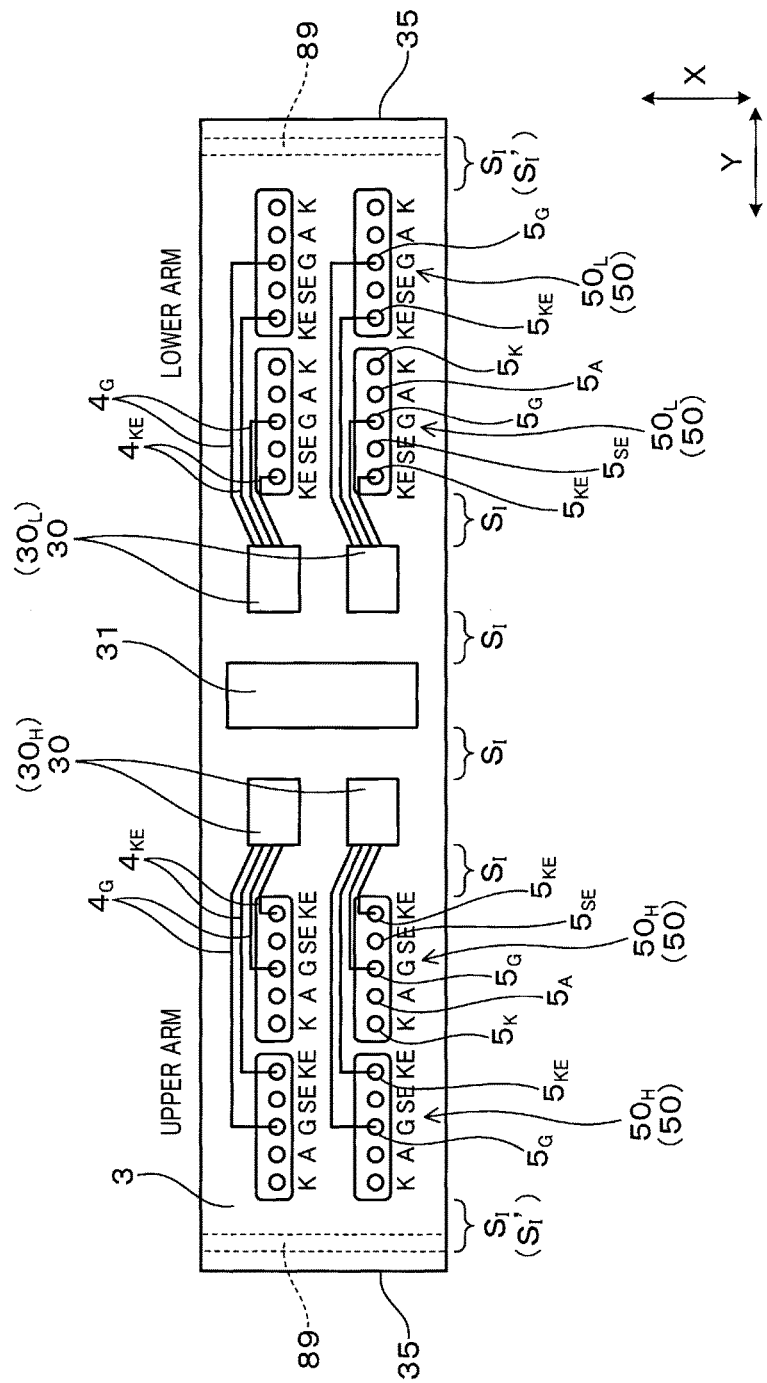
FIG. 15 is a plan view of part of a control circuit unit in the seventh embodiment.

As illustrated in FIG. 14 and FIG. 15, the upper arm drive circuit $30_H$ and the lower arm drive circuit $30_L$ are disposed between the upper arm connecting member group $50_H$ and the lower arm connecting member group $50_L$ in the Y direction.

As illustrated in FIG. 15, in the present embodiment, in a similar manner to the first embodiment, the reference connecting members $5_{KE}$ are connected to the drive circuits 30 with the reference wiring $4_{KE}$. Further, the control connecting members $5_G$ are connected to the drive circuits 30 with the control wiring $4_G$. Further, the reference connecting members $5_{KE}$ are formed at positions closer to the drive circuits 30 which are connected to the reference connecting members $5_{KE}$ and the control connecting members $5_G$, than the control connecting members $5_G$ in the Y direction are. More specifically, among a plurality of connecting members 5, connecting members 5 formed at positions closest to the drive circuits 30 in the Y direction are set as the reference connecting members $5_{KE}$.

As illustrated in FIG. 15, the upper arm drive circuit $30_H$ and the lower arm drive circuit $30_L$ are disposed between the upper arm connecting member group $50_H$ and the lower arm connecting member group $50_L$ in the Y direction. Further, a power supply circuit 31 which is connected to the upper arm drive circuit $30_H$ and the lower arm drive circuit $30_L$ is disposed between the upper arm drive circuit $30_H$ and the lower arm drive circuit $30_L$. The power supply circuit 31 is shared by the two drive circuits $30_H$ and $30_L$. Further, the drive circuits 30 in the present embodiment are configured with dedicated ICs. Insulating parts $S_I$ for securing insulation are formed between the drive circuits 30 and the connecting member groups 50, and between the drive circuits 30 and the power supply circuit 31. A low-voltage wiring 89 is provided at an edge portion 35 of the control circuit unit 3. Insulating parts $S_I$ are also formed between the low-voltage wiring 89 and the connecting member groups 50.

Operational effects of the present embodiment will be described. As illustrated in FIG. 15, in the present embodiment, in a similar manner to the first embodiment, the reference connecting members $5_{KE}$ are formed at positions closer to the drive circuits 30 than the control connecting members $5_G$ are. It is therefore possible to make the reference wiring $4_{KE}$ shorter than the control wiring $4_G$, so that it is possible to reduce the parasitic inductance $L_{KE}$ in the reference wiring $4_{KE}$.

Further, in the present embodiment, two drive circuits $30_H$ and $30_L$ are disposed between the upper arm connecting member group $50_H$ and the lower arm connecting member group $50_L$ in the Y direction. It is therefore possible to put the upper arm drive circuit $30_H$ closer to the lower arm drive circuit $30_L$, so that it is possible to share the power supply circuit 31 between the two drive circuits $30_H$ and $30_L$. Therefore, it is possible to reduce the number of power supply circuits 31, so that it is possible to reduce manufacturing cost of the control circuit unit 3. Further, it is possible to reduce an area of the control circuit unit 3.

Further, the individual connecting members 5 are connected to electrodes 21 ($21_{KE}$, $21_{SE}$, $21_G$, $21_A$ and $21_K$: see FIG. 5) which are different from one another, of the semiconductor element 2. As illustrated in FIG. 15, the connection order ($5_K$, $5_A$, $5_G$, $5_{SE}$ and $5_{KE}$) of the individual connecting members 5 which constitute the upper arm connecting member group $50_H$, to the above-described electrode 21 and the connection order ($5_{KE}$, $5_{SE}$, $5_G$, $5_A$ and $5_K$) of the individual connecting members 5 which constitute the lower arm connecting member group $50_L$, to the above-described electrode 21 are reversed with respect to each other, from one side (for example, a left side in FIG. 15) toward the other side (for example, a right side in FIG. 15) in the Y direction.

It is therefore possible to make the upper arm connecting member group $50_H$ and the lower arm connecting member group $50_L$ bilaterally symmetric while putting the reference connecting member $5_{KE}$ closer to the drive circuit 30 for each on the upper arm side and on the lower arm side. It is therefore possible to simplify a configuration of the control circuit unit 3, and facilitate design.

The seventh embodiment has a configuration and operational effects similar to those in the first embodiment for other points.

(Eighth Embodiment)

Figure 17:
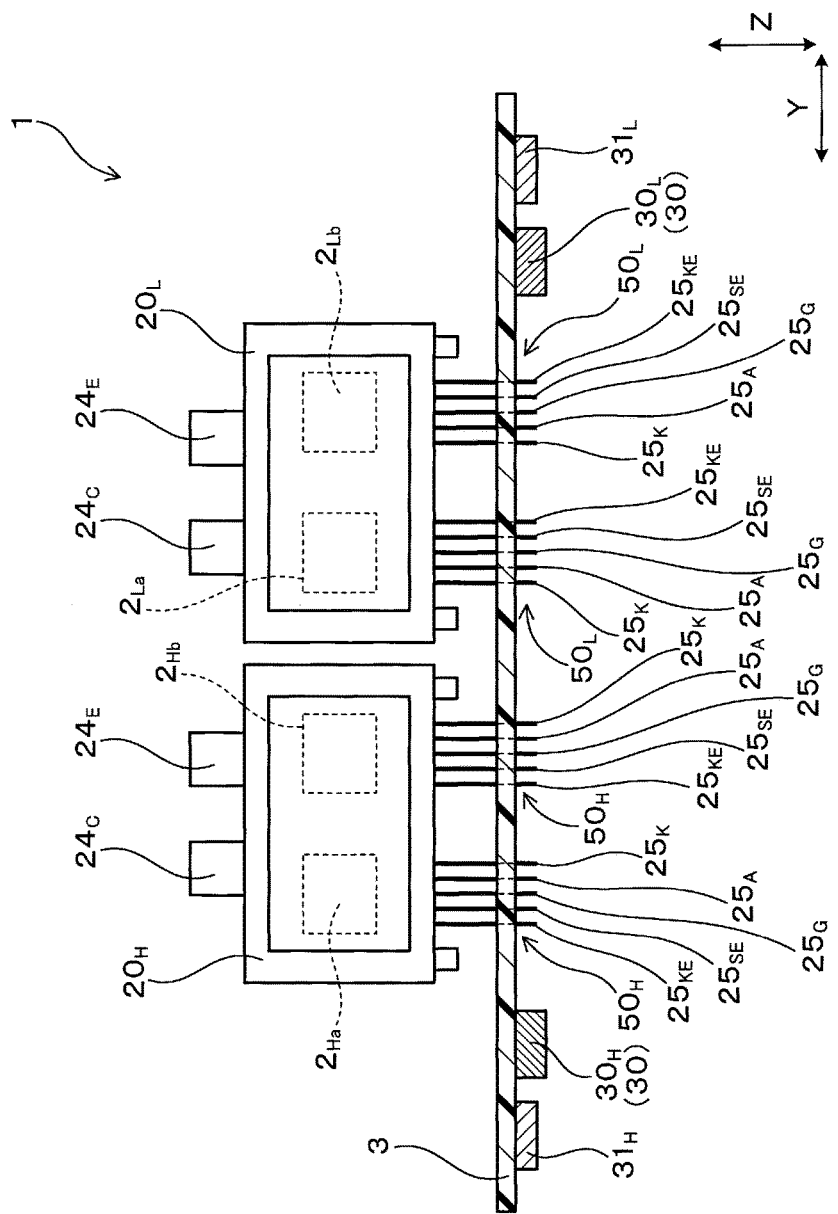
FIG. 17 is a schematic cross-section diagram of a power conversion apparatus in an eighth embodiment.
Figure 18:
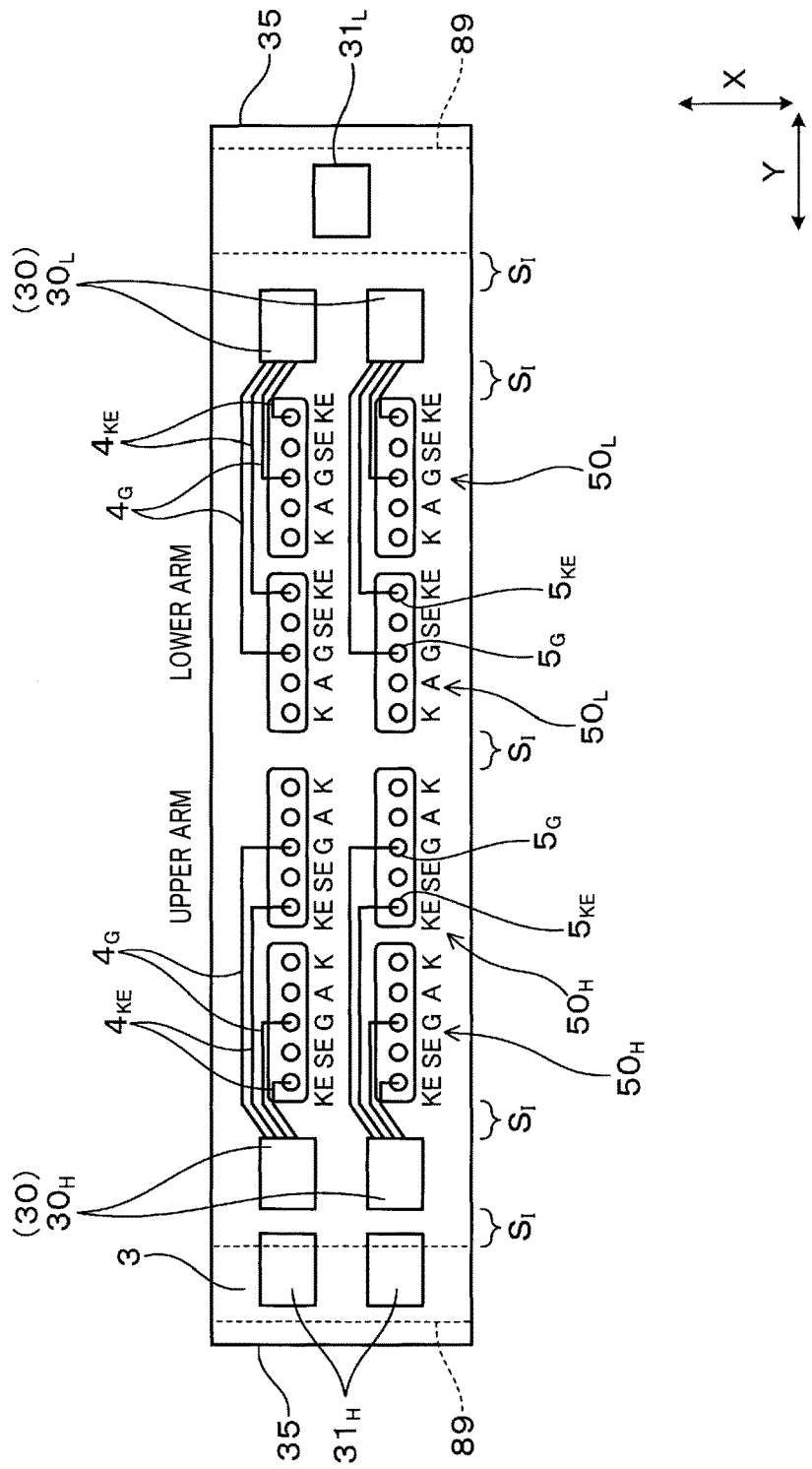
FIG. 18 is a plan view of part of a control circuit unit in the eighth embodiment.

The present embodiment is an example in which a position where the drive circuits 30 are disposed is changed. As illustrated in FIG. 17 and FIG. 18, in the present embodiment, in a similar manner to the seventh embodiment, the reference connecting members $5_{KE}$ are formed at positions closer to the drive circuits 30 which are connected to the reference connecting members $5_{KE}$ and the control connecting members $5_G$, than the control connecting member $5_G$ is. By this means, the reference wiring $4_{KE}$ is made shorter than the control wiring $4_G$, and the inductance $L_{KE}$ of the reference wiring $4_{KE}$ is made smaller.

Further, as illustrated in FIG. 18, in the present embodiment, the upper arm drive circuit $30_H$, the upper arm connecting member group $50_H$, the lower arm connecting member group $50_L$ and the lower arm drive circuit $30_L$ are disposed in this order in the Y direction.

Insulating parts $S_I$ for insulation are formed between the connecting member groups 50 and the drive circuits 30, and between the upper arm connecting member group $50_H$ and the lower arm connecting member group $50_L$. Further, in a similar manner to the seventh embodiment, the low-voltage wiring 89 is provided at the edge portion 35 of the control circuit unit 3. The insulating part $S_I$ is also formed between the low-voltage wiring 89 and the drive circuit $30_H$.

Operational effects of the present embodiment will be described. As illustrated in FIG. 18, in the present embodiment, the upper arm drive circuit $30_H$, the upper arm connecting member group $50_H$, the lower arm connecting member group $50_L$ and the lower arm drive circuit $30_L$ are disposed in this order in the Y direction.

It is therefore possible to make the control circuit unit 3 symmetrical on the upper arm side and on the lower arm side, so that it is possible to simplify a circuit configuration of the control circuit unit 3. Therefore, it is possible to easily design the control circuit unit 3.

Further, if the above-described configuration is employed, it is possible to make the control circuit unit 3 even smaller. That is, as illustrated in FIG. 15, while it is possible to provide the drive circuits $30_H$ and $30_L$ between the two connecting member groups $50_H$ and $50_L$, in this case, it becomes necessary to secure insulating parts $S_I$ between the connecting member groups 50 and the low-voltage wiring 89. In contrast to this, if the drive circuits 30 are disposed outside the connecting member groups 50 in the Y direction as in the present embodiment, because the drive circuits 30 are put between the connecting member groups 50 and the low-voltage wiring 89, it is possible to keep the low-voltage wiring 89 away from the connecting member groups 50. Therefore, in a similar manner to the seventh embodiment (see FIG. 15), it becomes unnecessary to form dedicated insulating parts $S_I'$ for insulating between the connecting member groups 50 and the low-voltage wiring 89, so that it is possible to make an area of the control circuit unit 3 even smaller.

The eighth embodiment has a configuration and operational effects similar to those in the first embodiment for other points.

(Ninth Embodiment)

Figure 21:
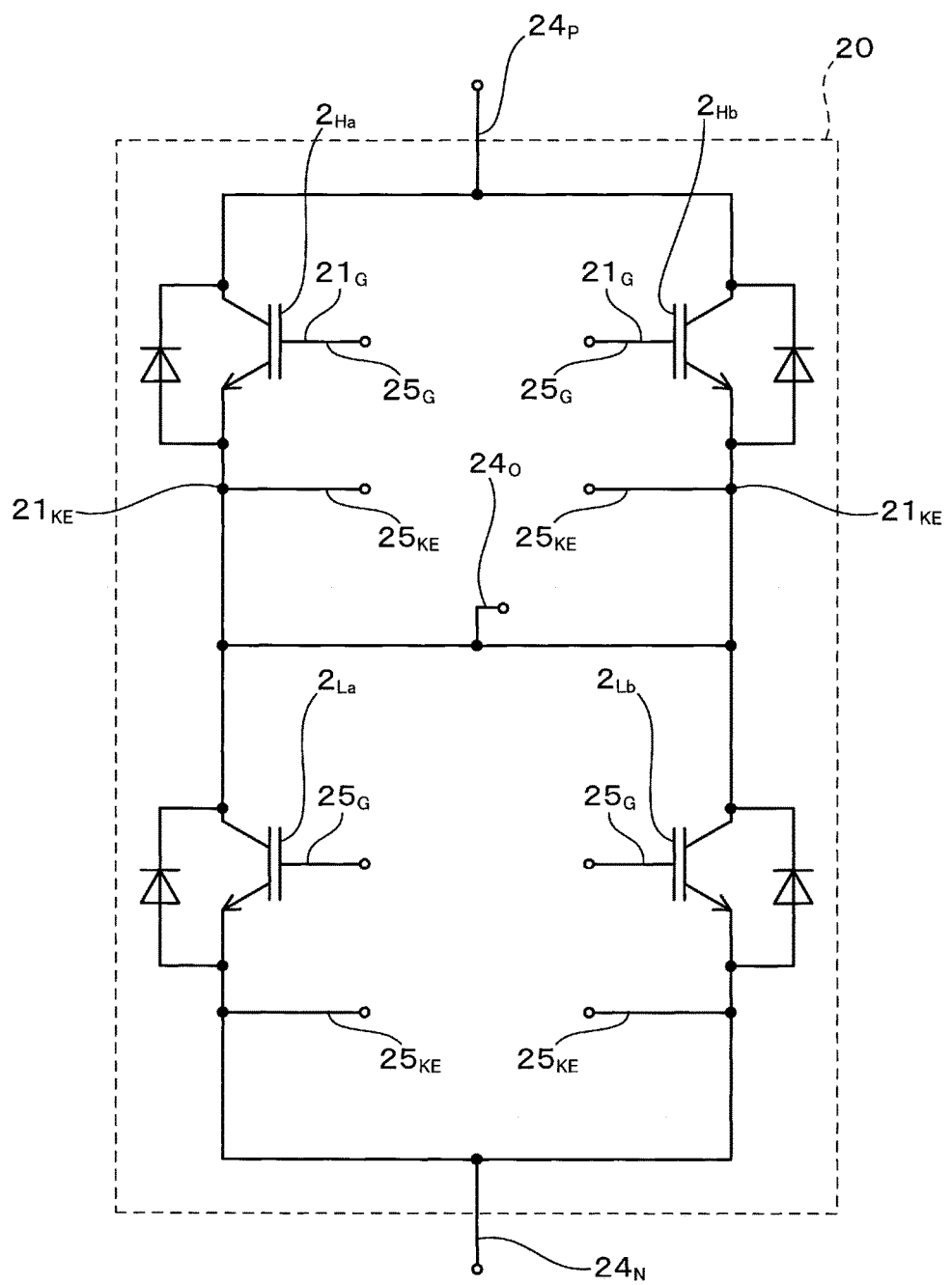
FIG. 21 is a conceptual diagram of a semiconductor module in the ninth embodiment.

The present embodiment is an example in which a structure of the semiconductor module 20 and positions where the drive circuits 30 are disposed are changed. As illustrated in FIG. 21, in the present embodiment, a plurality of upper arm semiconductor elements $2_H$ ($2_{Ha}$ and $2_{Hb}$) which are connected in parallel to each other and a plurality of lower arm semiconductor elements $2_L$ ($2_{La}$ and $2_{Lb}$) which are connected in parallel to each other are provided inside the same semiconductor module 20.

Figure 19:
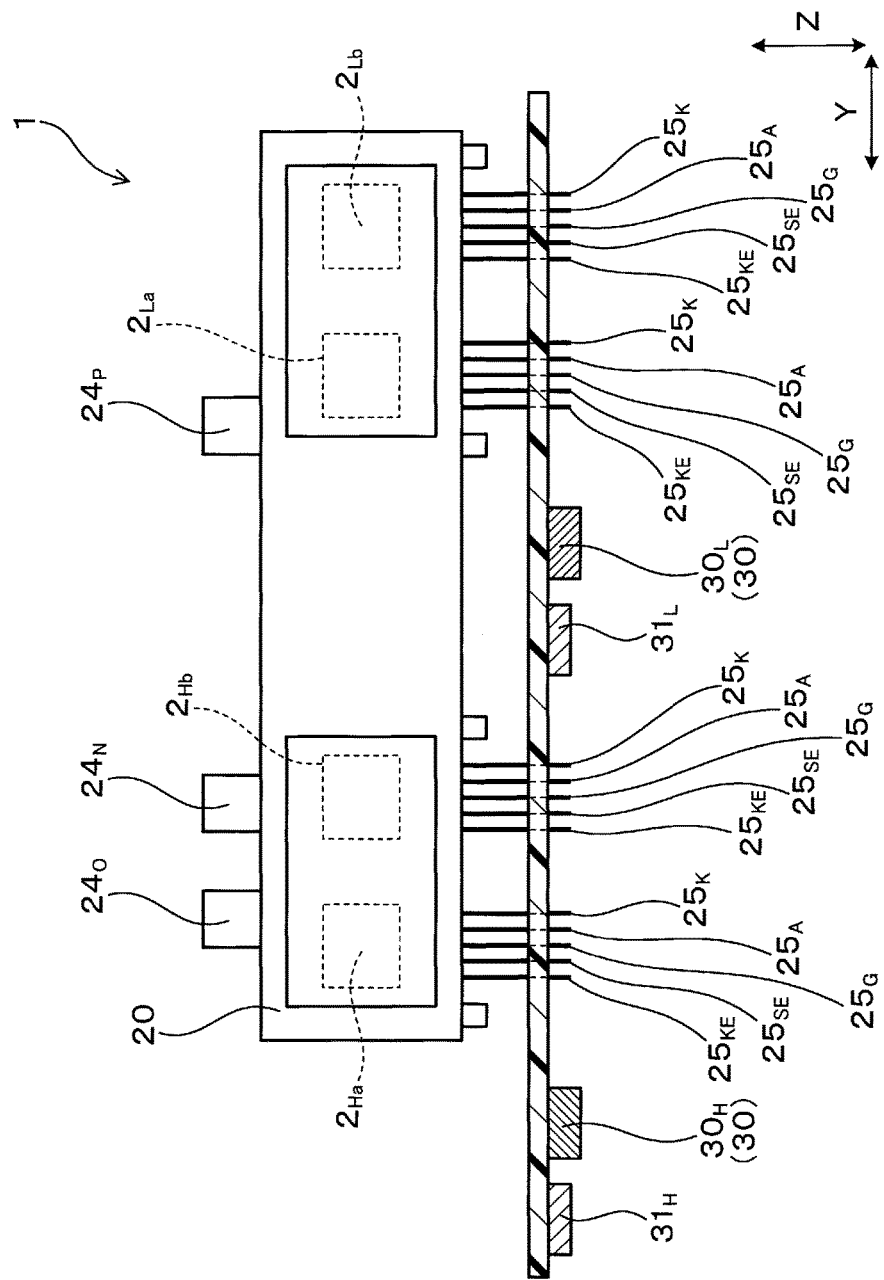
FIG. 19 is a schematic cross-section diagram of a power conversion apparatus in a ninth embodiment.
Figure 20:
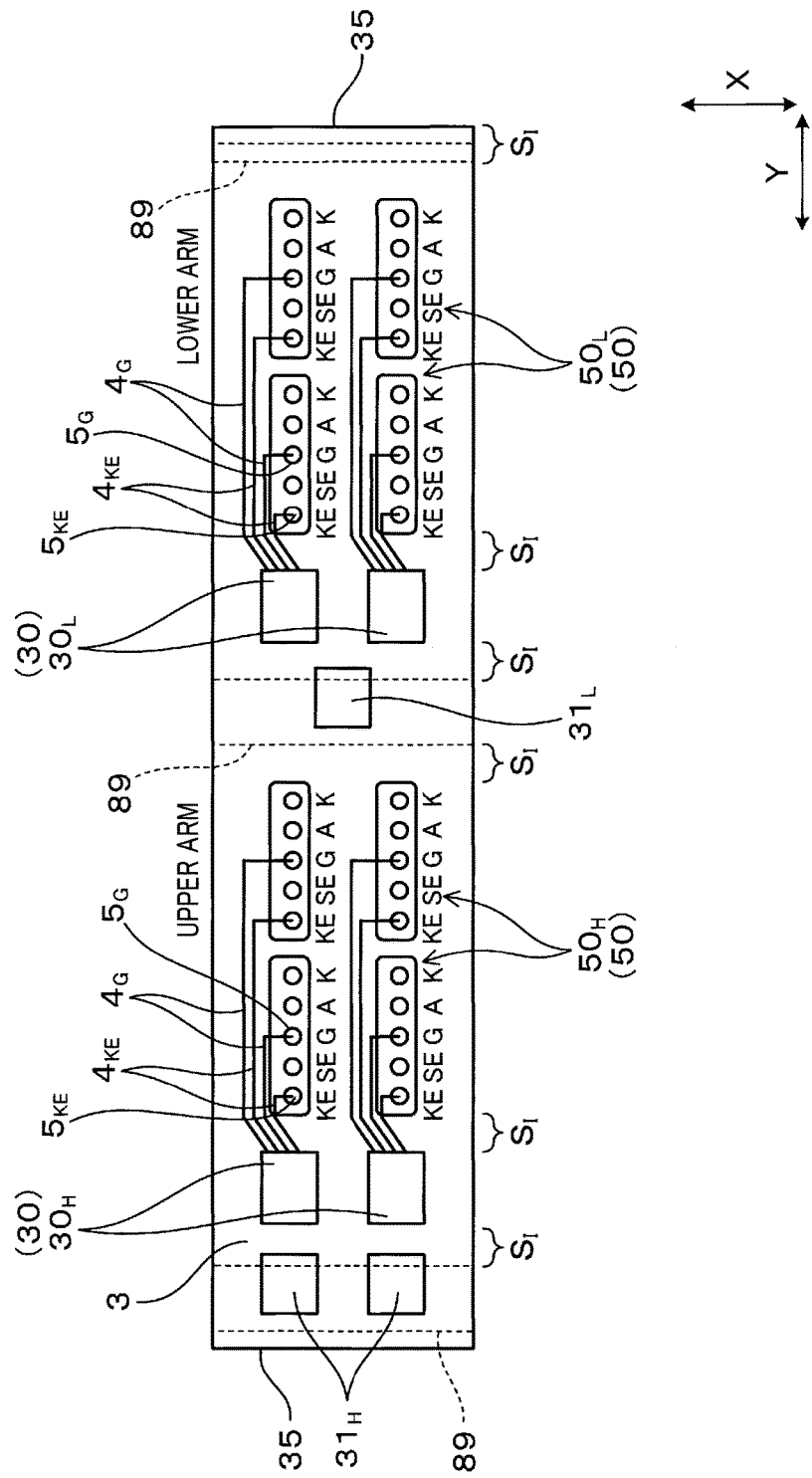
FIG. 20 is a plan view of part of a control circuit unit in the ninth embodiment.

Further, as illustrated in FIG. 19 and FIG. 20, in the present embodiment, the upper arm drive circuit $30_H$, the upper arm connecting member group $50_H$, the lower arm drive circuit $30_L$ and the lower arm connecting member group $50_L$ are disposed in this order in the Y direction. Further, in the present embodiment, in a similar manner to the first embodiment, the reference connecting members $5_{KE}$ are disposed at positions closer to the drive circuit 30 than the control connecting members $5_G$ are. By this means, the reference wiring $4_{KE}$ is made shorter than the control wiring $4_G$, and the inductance $L_{KE}$ of the reference wiring $4_{KE}$ is made smaller.

Operational effects of the present embodiment will be described. In the present embodiment, as illustrated in FIG. 19 and FIG. 21, a plurality of upper arm semiconductor elements $2_H$ ($2_{Ha}$ and $2_{Hb}$) which are connected in parallel to each other, and a plurality of lower arm semiconductor elements $2_L$ ($2_{La}$ and $2_{Lb}$) which are connected in parallel to each other are provided in the same semiconductor module 20.

It is therefore possible to reduce the number of semiconductor modules 20. Therefore, it is possible to reduce the number of parts of the power conversion apparatus 1, so that it is possible to reduce manufacturing cost.

The ninth embodiment has a configuration and operational effects similar to those in the first embodiment for other points.

Note that, while, in the present embodiment, as illustrated in FIG. 21, the plurality of upper arm semiconductor elements $2_H$ ($2_{Ha}$ and $2_{Hb}$) and the plurality of lower arm semiconductor elements $2_L$ ($2_{La}$ and $2_{Lb}$), which are connected in parallel to each other are provided in the same semiconductor module 20, the present invention is not limited to this. That is, it is also possible to incorporate the individual semiconductor elements 2 ($2_H$ and $2_L$) into different semiconductor modules 20 and connect these semiconductor modules 20 to the control circuit unit 3 illustrated in FIG. 20. Further, it is also possible to incorporate one upper arm semiconductor element $2_H$ and one lower arm semiconductor element $2_L$ into each one of semiconductor modules 20 and connect the semiconductor modules 20 to the control circuit unit 3 illustrated in FIG. 20.

(Tenth Embodiment)

Figure 22:
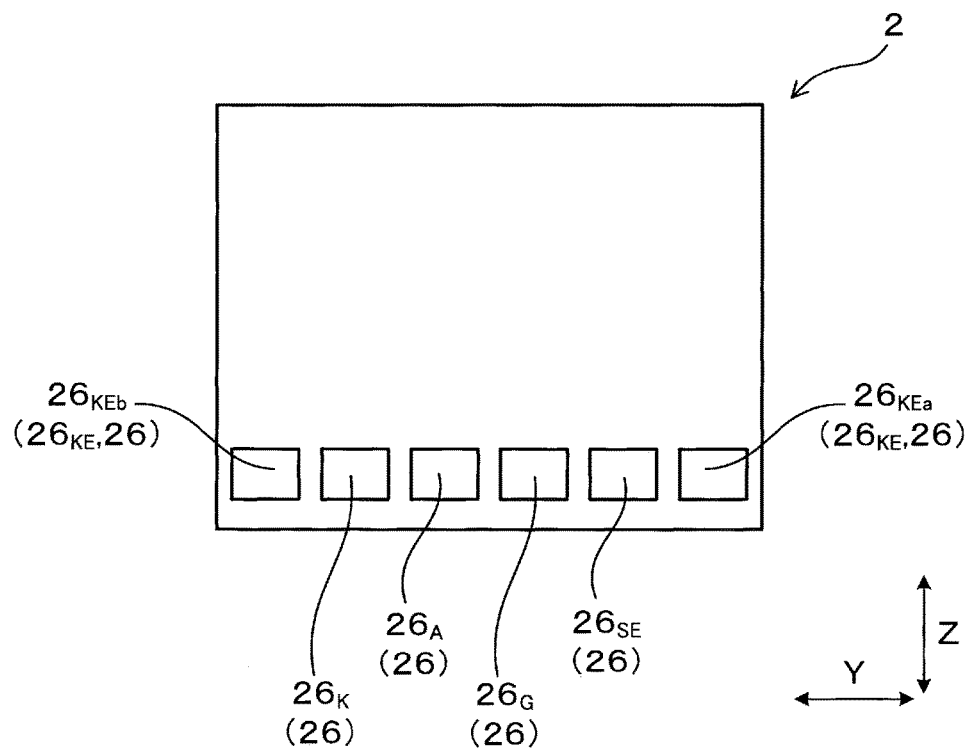
FIG. 22 is a plan view of a semiconductor element in a tenth embodiment.
Figure 23:
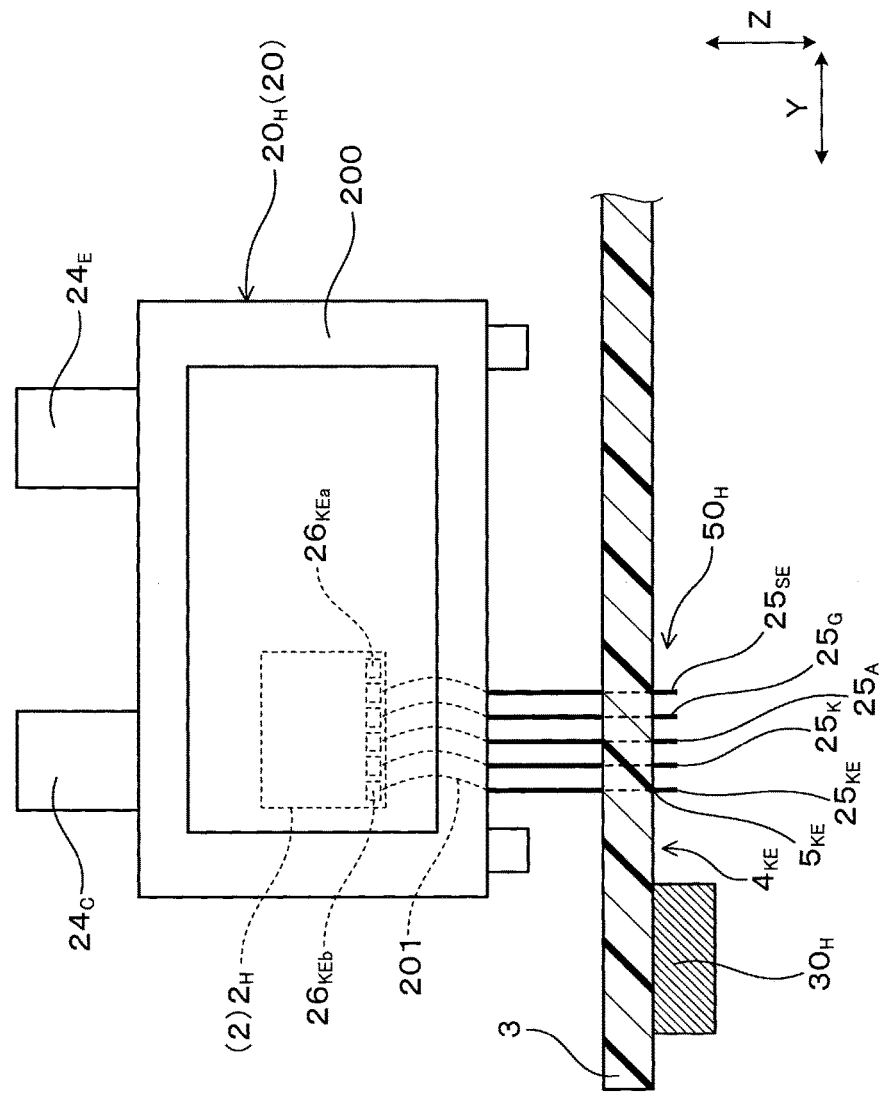
FIG. 23 is a cross-section diagram of an upper arm semiconductor module and a control circuit unit in the tenth embodiment.
Figure 24:
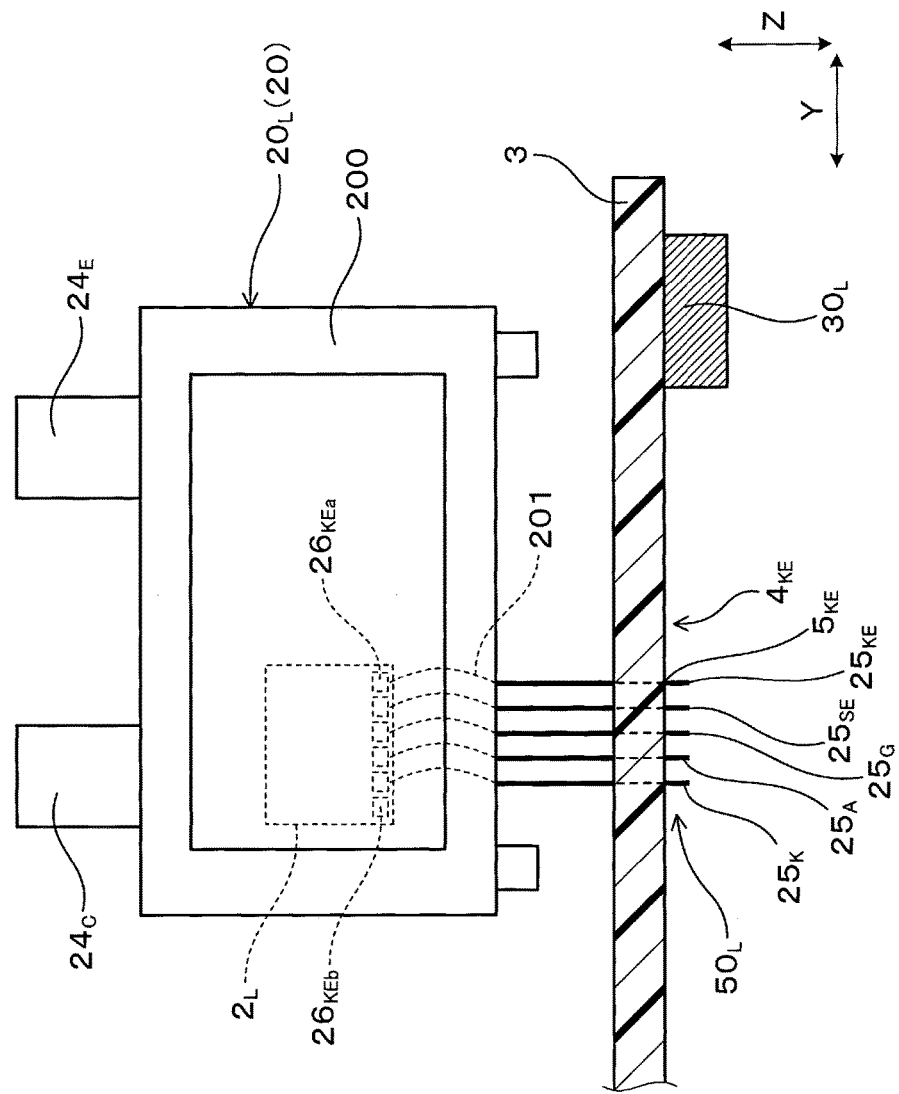
FIG. 24 is a cross-section diagram of a lower arm semiconductor module and a control circuit unit in the tenth embodiment.

The present embodiment is an example in which a structure of the semiconductor element 2 is changed. As illustrated in FIG. 22, the semiconductor element 2 in the present embodiment includes a plurality of pads 26 for electrically connecting to the control circuit unit 3. These plurality of pads 26 are arranged in the Y direction. Two pads 26 among the plurality of pads 26 are reference pads $26_{KE}$ ($26_{KEa}$ and $26_{KEb}$) for electrically connecting the reference electrodes $21_{KE}$ of the semiconductor elements 2 to the control circuit unit 3. As illustrated in FIG. 23 and FIG. 24, among the plurality of reference pads $26_{KE}$ ($26_{KEa}$ and $26_{KEb}$), the reference pad $26_{KE}$ disposed at a position closer to the drive circuit 30 in the Y direction is electrically connected to the control circuit unit 3.

As illustrated in FIG. 23, the semiconductor module 20 includes a body member 200 in which the semiconductor element 2 is incorporated. A plurality of control terminals 25 project from the body member 200. As described above, two reference pads $26_{KE}$ of a first reference pad $26_{KEa}$ and a second reference pad $26_{KEb}$ are formed at the semiconductor element 2. As illustrated in FIG. 23, in the upper arm semiconductor module $20_H$, the second reference pad $26_{KEb}$ is disposed at a position closer to the upper arm drive circuit $30_H$ in the Y direction than the first reference pad $26_{KEa}$ is. The second reference pad $26_{KEb}$ is connected to the reference control terminal $25_{KE}$ using a wire 201. By this means, the second reference pad $26_{KEb}$ is electrically connected to the control circuit unit 3.

Further, as illustrated in FIG. 24, in the lower arm semiconductor element $2_L$, the first reference pad $26_{KEa}$ is disposed at a position closer to the lower arm drive circuit $30_L$ than the second reference pad $26_{KEb}$ is. The first reference pad $26_{KEa}$ is connected to the reference control terminal $25_{KE}$ using the wire 201. By this means, the first reference pad $26_{KEa}$ is electrically connected to the control circuit unit 3.

Operational effects of the present embodiment will be described. If the above-described configuration is employed, it is possible to make a structure of the upper arm semiconductor element $2_H$ the same as a structure of the lower arm semiconductor element $2_L$, and it is possible to provide the reference control terminal $25_{KE}$ at a position closer to the drive circuit 30 for each on the upper arm side and on the lower arm side. It is therefore possible to shorten each of the lengths of the reference wirings $4_{KE}$ on the upper arm side and on the lower arm side using the same type of semiconductor elements $2_H$ and $2_L$. Therefore, it is possible to reduce types of semiconductor elements 2 to be used, reduce manufacturing cost of the power conversion apparatus 1 and reduce the inductance $L_{KE}$ of the reference wiring $4_{KE}$.

The tenth embodiment has a configuration and operational effects similar to those in the first embodiment for other points.

(Eleventh Embodiment)

Figure 25:
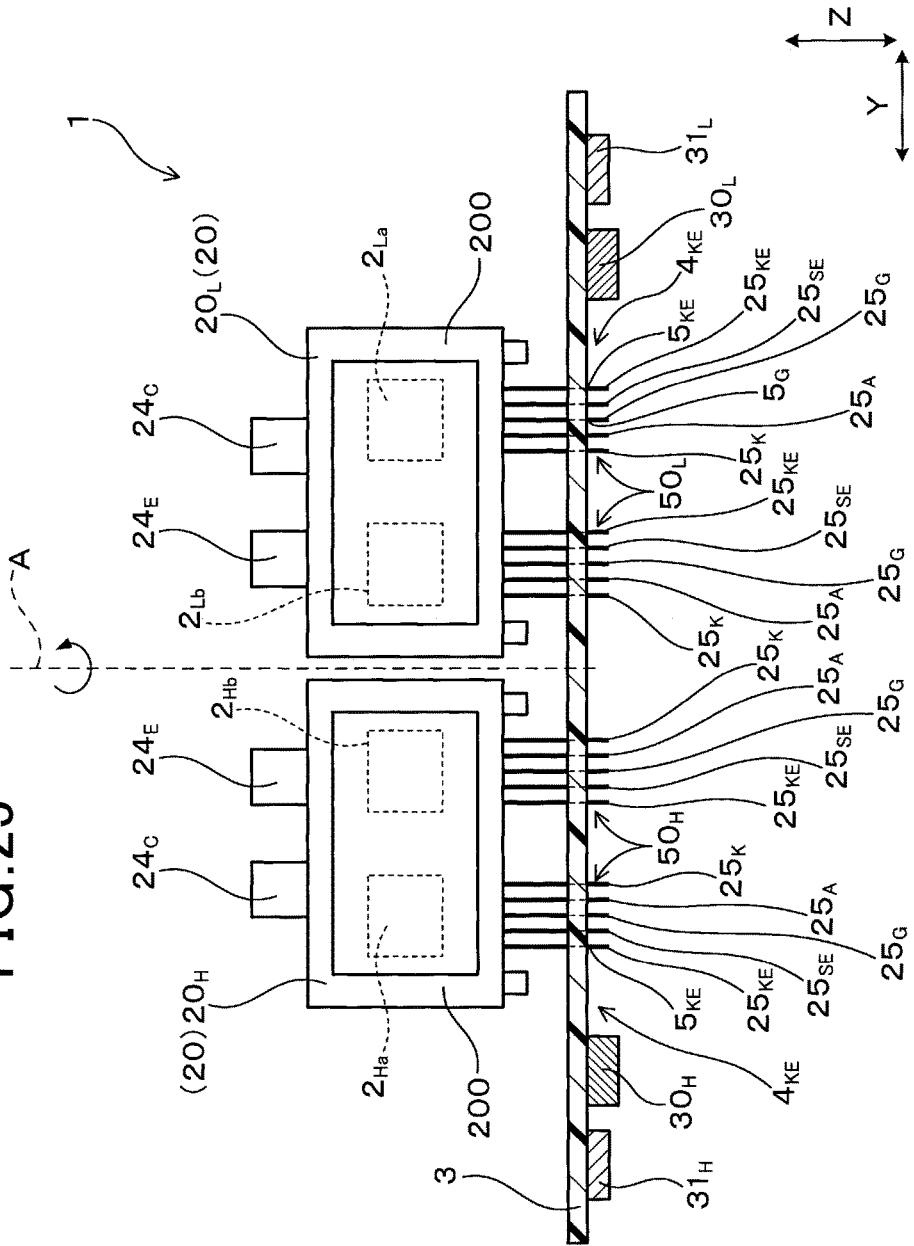
FIG. 25 is a schematic cross-section diagram of a power conversion apparatus in an eleventh embodiment.

The present embodiment is an example in which the configuration of the semiconductor module 20 is changed. As illustrated in FIG. 25, in the present embodiment, in a similar manner to the first embodiment, the reference connecting members $5_{KE}$ are disposed at positions closer to the drive circuits 30 to which the reference connecting members $5_{KE}$ and the control connecting members $5_G$ are connected, than the control connecting members $5_G$ in the Y direction are. By this means, the length of the reference wiring $4_{KE}$ is made shorter, and the inductance $L_{KE}$ of the reference wiring $4_{KE}$ is made smaller.

Further, as illustrated in FIG. 25, in the present embodiment, the upper arm semiconductor module $20_H$ and the lower arm semiconductor module $20_L$ are arranged in the Y direction. The lower arm semiconductor module $20_L$ is connected to the control circuit unit 3 in an attitude in which the upper arm semiconductor module $20_H$ is inverted by 180° around a rotation axis A which is located between the two semiconductor modules $20_H$ and $20_L$ and which is parallel to a projecting direction (hereinafter, also referred to as a Z direction) of the control terminals 25.

By this means, it is possible to use the same type of the semiconductor module 20 as the upper arm semiconductor module $20_H$ and the lower arm semiconductor module $20_L$. It is therefore possible to reduce the number of types of the semiconductor modules 20 to be used, so that it is possible to reduce manufacturing cost of the power conversion apparatus 1.

Further, if the above-described configuration is employed, it is possible to put the reference control terminal $25_{KE}$ closer to the drive circuit 30 for each on the upper arm side and on the lower arm side using the same type of the semiconductor module 20. It is therefore possible to shorten the reference wiring $4_{KE}$, so that it is possible to make the inductance $L_{KE}$ of the reference wiring $4_{KE}$ smaller.

The eleventh embodiment has a configuration and operational effects similar to those in the first embodiment for other points.

(Twelfth Embodiment)

Figure 26:
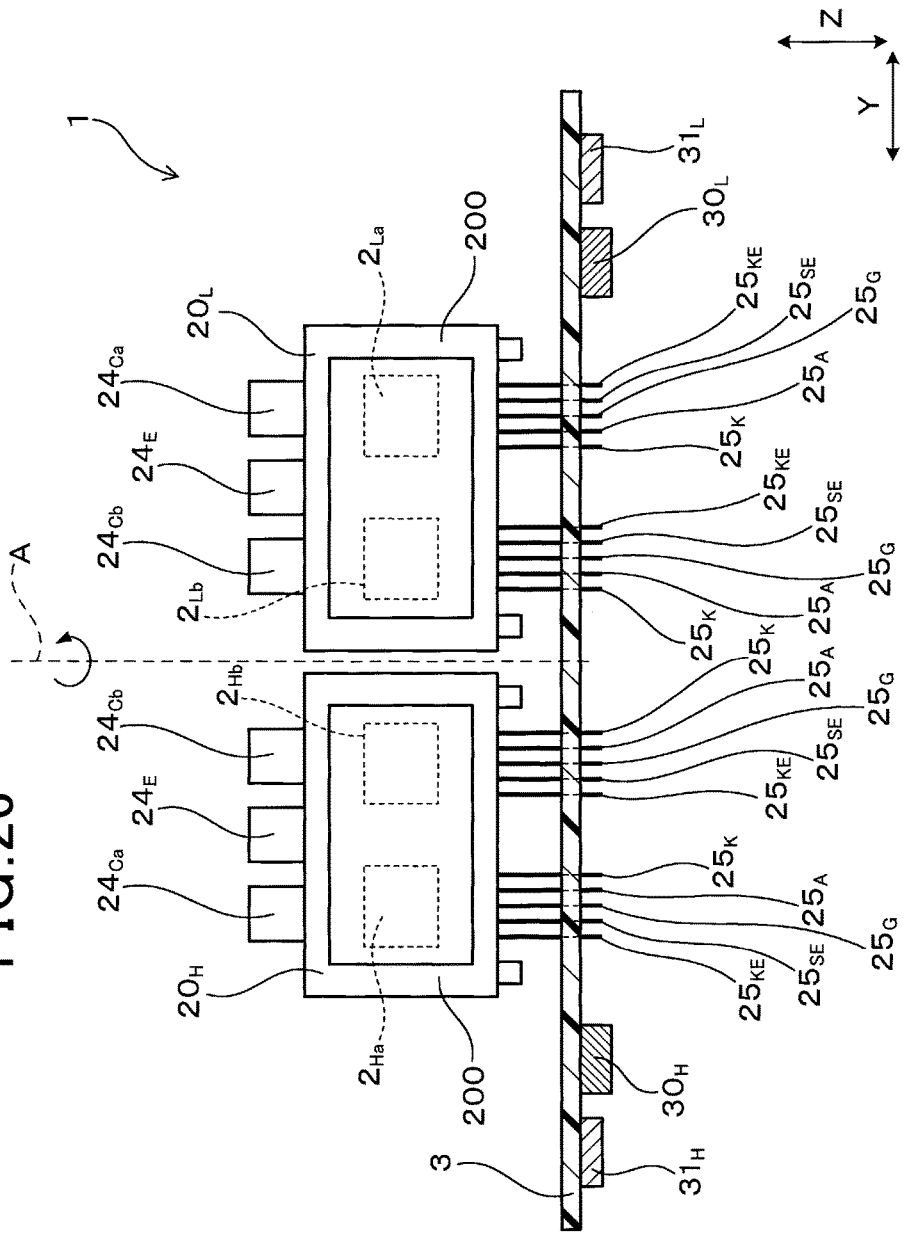
FIG. 26 is a schematic cross-section diagram of a power conversion apparatus in a twelfth embodiment.
Figure 27:
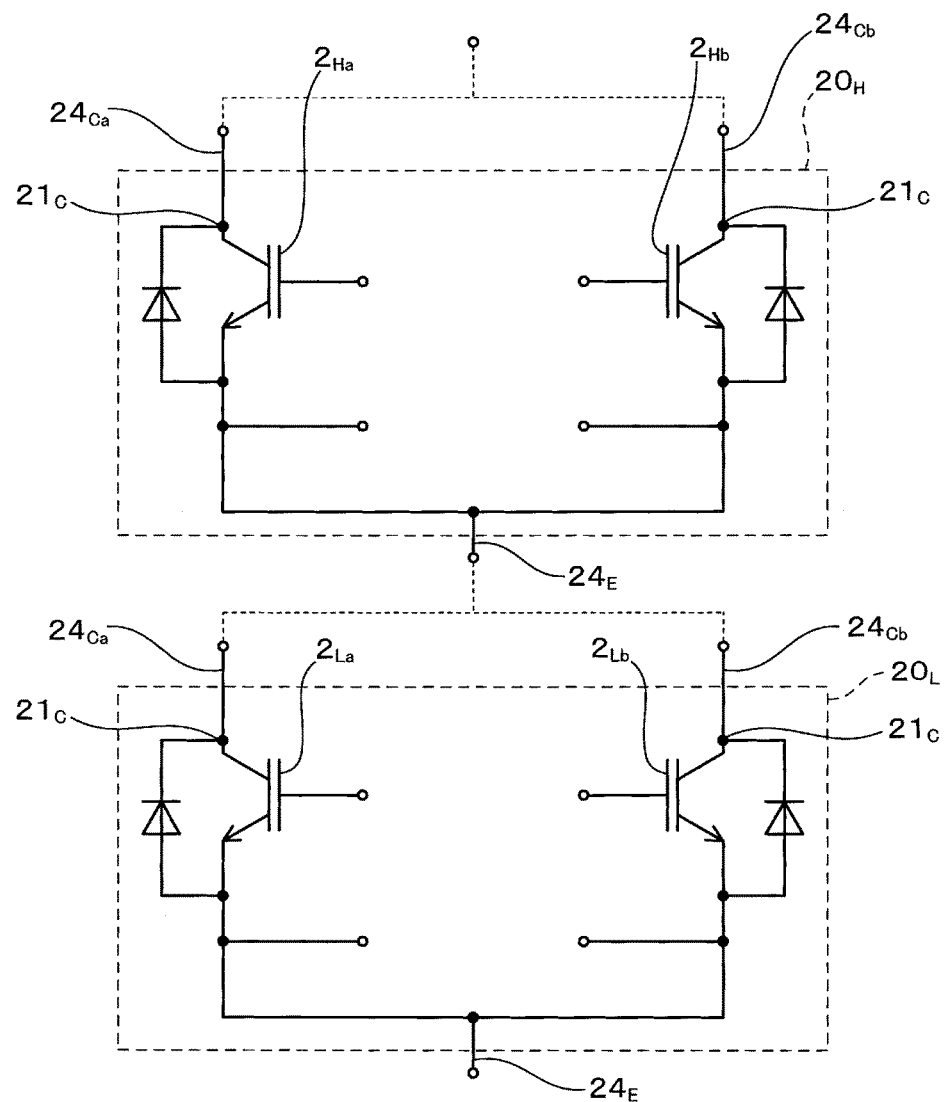
FIG. 27 is a conceptual diagram of a semiconductor module in the twelfth embodiment.

The present embodiment is an example in which a type of the semiconductor module 2 is changed. As illustrated in FIG. 27, in the present embodiment, two upper arm semiconductor elements $2_H$ which are connected in parallel to each other are provided in one upper arm semiconductor module $20_H$. Further, two lower arm semiconductor elements $2_L$ which are connected in parallel to each other are provided in one lower arm semiconductor module $20_L$. The semiconductor modules $20_H$ and $20_L$ include two collector terminals $24_C$ ($24_{Ca}$ and $24_{Cb}$) and one emitter terminal $24_E$. By two collector terminals $24_C$ being provided in this manner, parasitic inductances in the collector electrodes $21_C$ of the semiconductor elements 2 are equalized. As illustrated in FIG. 26, the emitter terminal $24_E$ is disposed between the two collector terminals $24_C$.

Further, as illustrated in FIG. 26, in the present embodiment, in a similar manner to the eleventh embodiment, the upper arm semiconductor module $20_H$ and the lower arm semiconductor module $20_L$ are arranged in the Y direction. The lower arm semiconductor module $20_L$ is connected to the control circuit unit 3 in an attitude in which the upper arm semiconductor module $20_H$ is rotated by 180° around a rotation axis A which is located between the two semiconductor modules $20_H$ and $20_L$ and which is parallel to the Z direction.

The twelfth embodiment has a configuration and operational effects similar to those in the first embodiment for other points.

(Thirteenth Embodiment)

Figure 28:
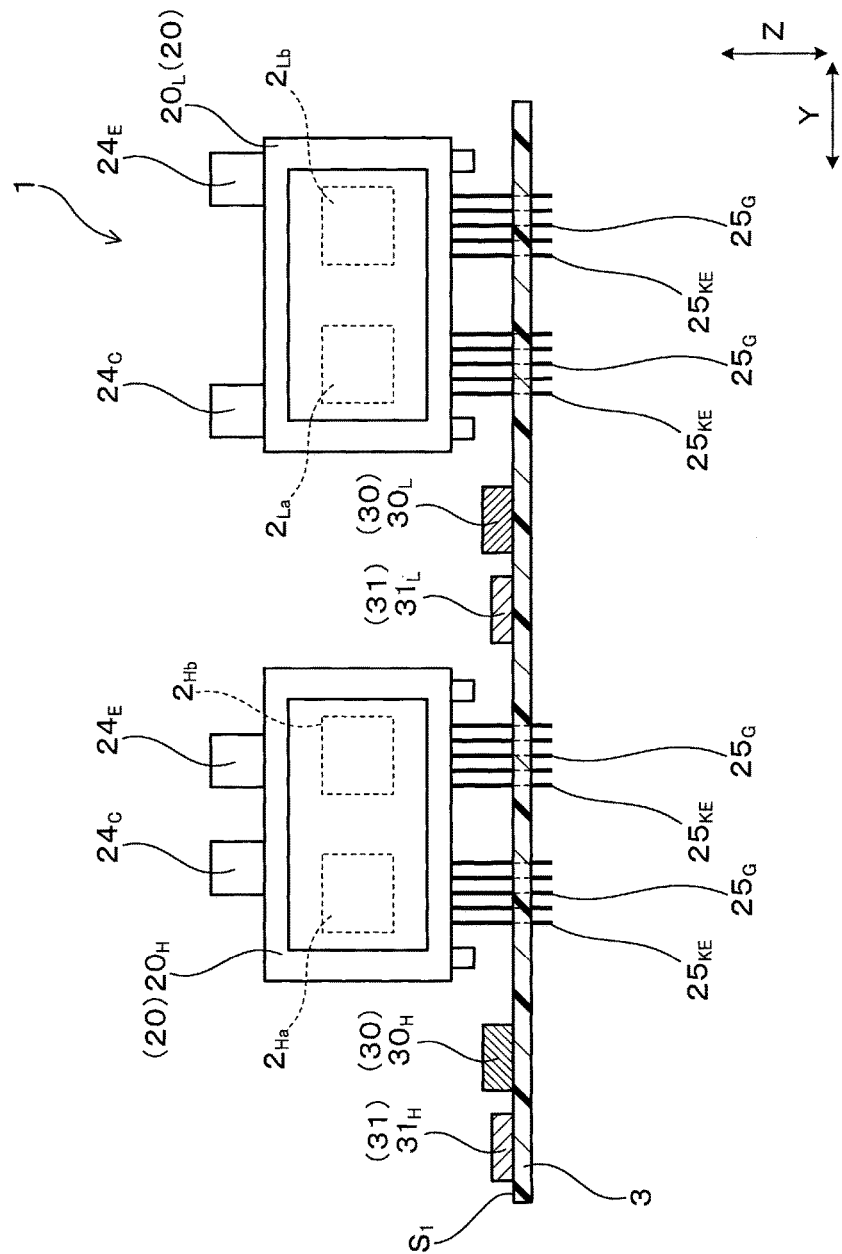
FIG. 28 is a schematic cross-section diagram of a power conversion apparatus in a thirteenth embodiment.

The present embodiment is an example in which positions where the drive circuits 30 and the power supply circuits 31 are disposed. As illustrated in FIG. 28, in the present embodiment, the drive circuits 30 and the power supply circuits 31 are disposed on a surface $S_I$ on the semiconductor module 20 side of the control circuit unit 3.

The thirteenth embodiment has a configuration and operational effects similar to those in the first embodiment for other points.

(Fourteenth Embodiment)

Figure 29:
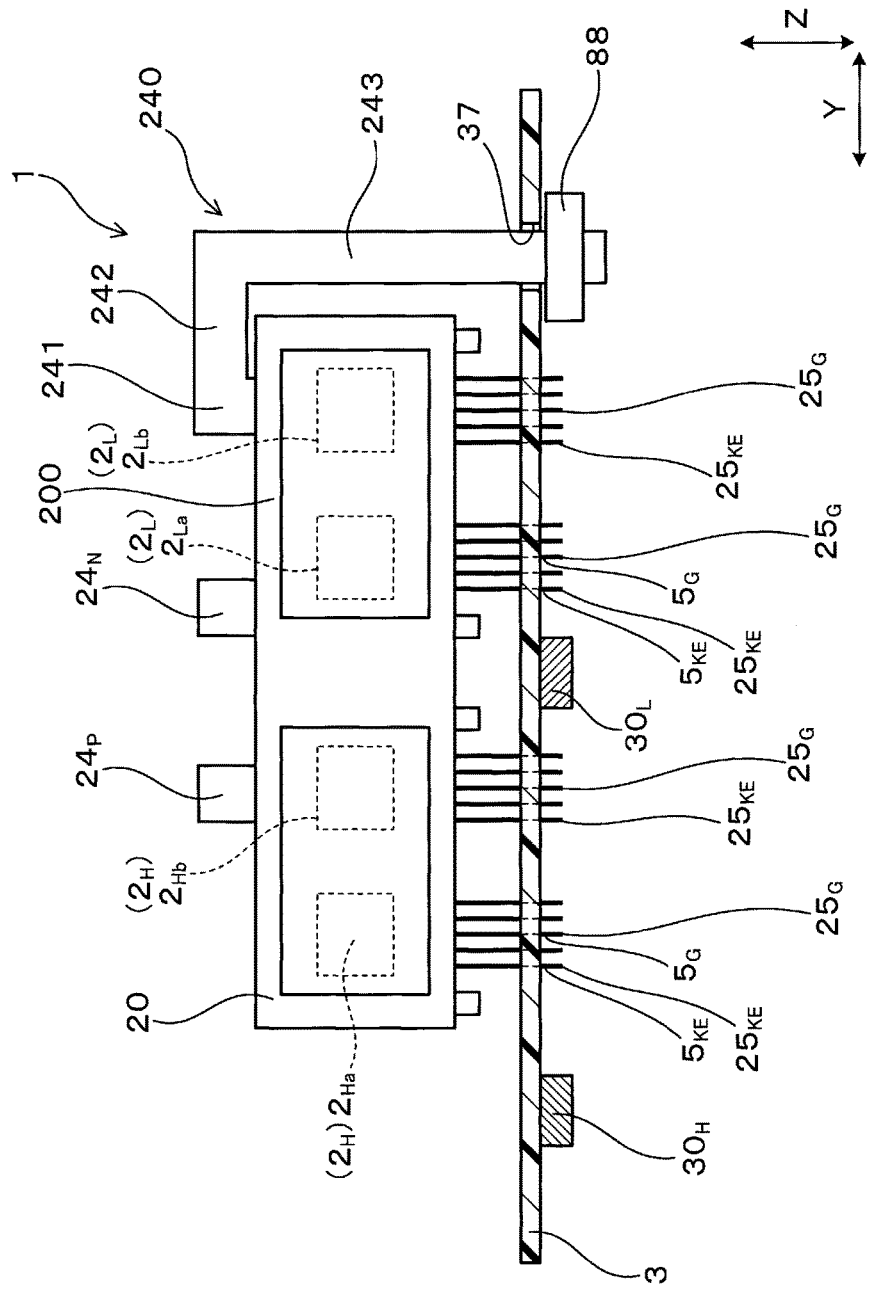
FIG. 29 is a schematic cross-section diagram of a power conversion apparatus in a fourteenth embodiment.

The present embodiment is an example in which the configuration of the semiconductor module 20 is changed. As illustrated in FIG. 29, in the present embodiment, two upper arm semiconductor elements $2_H$ ($2_{Ha}$ and $2_{Hb}$) which are connected in parallel to each other, and two lower arm semiconductor elements $2_L$ ($2_L$ and $2_{Lb}$) which are connected in parallel to each other are provided in one semiconductor module 20. An output terminal $24_O$ of the semiconductor module 20 includes a first part 241 projecting to an opposite side of the control circuit unit 3 from the body member 200, a second part 242 extending in the Y direction from the first part 241, and a third part 243 projecting on the control circuit unit 3 side in the Z direction from the second part 242. A through-hole 37 is formed at the control circuit unit 3. The third part 243 is inserted into the through-hole 37. A current sensor 88 for measuring an output current is attached to the third part 243.

The fourteenth embodiment has a configuration and operational effects similar to those in the first embodiment for other points.

(Fifteenth Embodiment)

Figure 30:
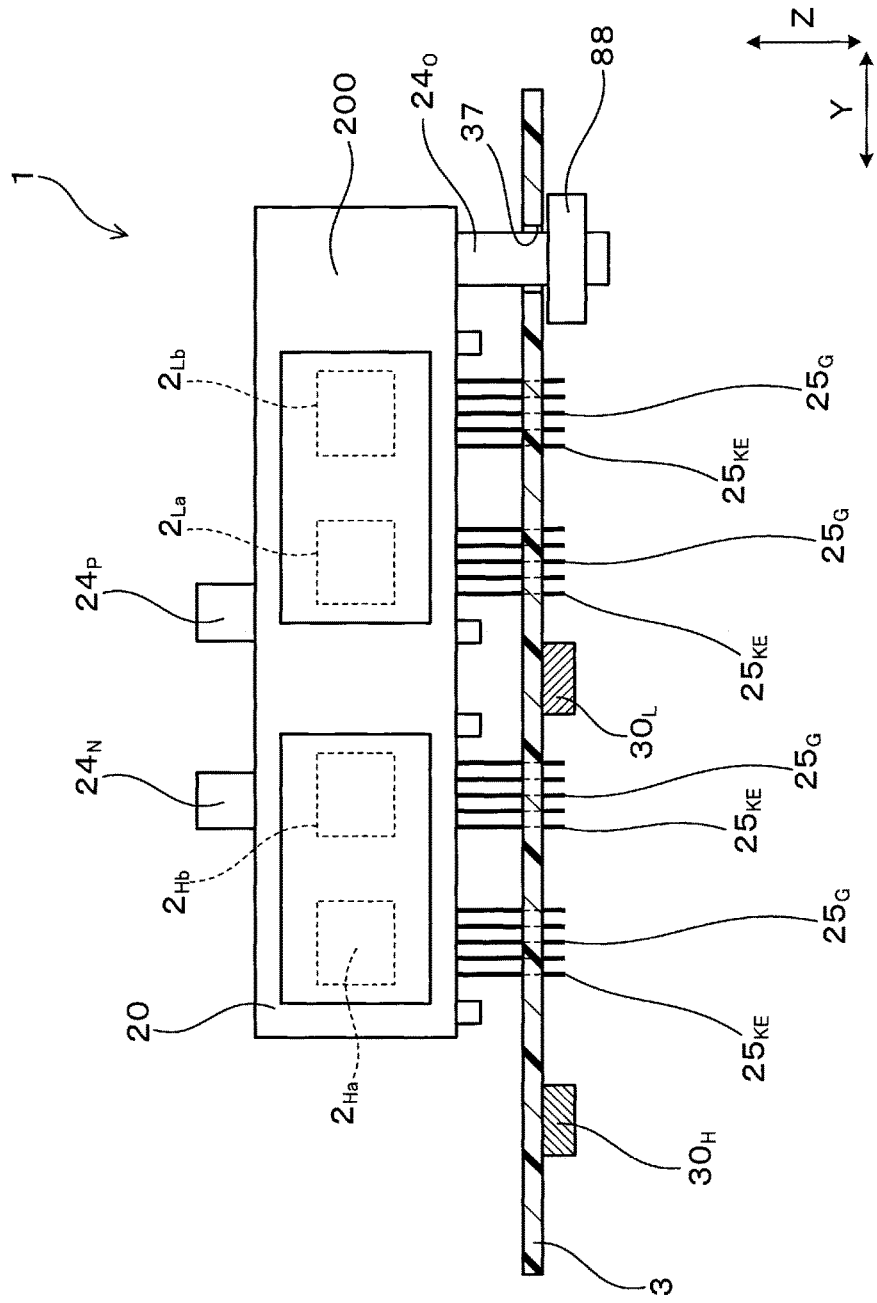
FIG. 30 is a schematic cross-section diagram of a power conversion apparatus in a fifteenth embodiment.

The present embodiment is an example in which a structure of the semiconductor module 20 is changed. As illustrated in FIG. 30, in the present embodiment, in a similar manner to the fourteenth embodiment, two upper arm semiconductor elements $2_H$ which are connected in parallel to each other and two lower arm semiconductor elements $2_L$ which are connected in parallel to each other are provided in one semiconductor module 20. An output terminal $24_O$ projects on the control circuit unit 3 side in the Z direction from the body member 200. A through-hole 37 is formed at the control circuit unit 3, and the output terminal $24_O$ is inserted into the through-hole 37. Further, a current sensor 88 for measuring an output current is attached to the output terminal $24_O$.

The fifteenth embodiment has a configuration and operational effects similar to those in the first embodiment for other points.

(Sixteenth Embodiment)

Figure 31:
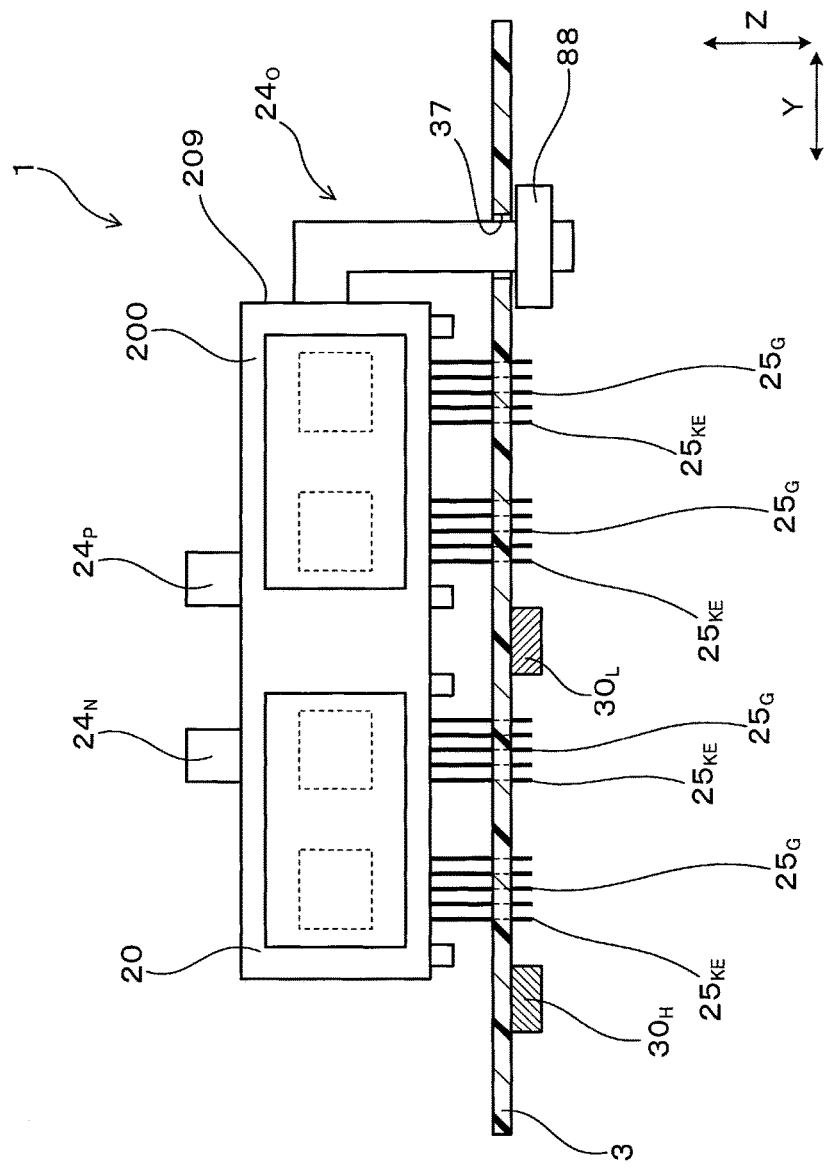
FIG. 31 is a schematic cross-section diagram of a power conversion apparatus in a sixteenth embodiment.

The present embodiment is an example in which the configuration of the semiconductor module 20 is changed. As illustrated in FIG. 31, an output terminal $24_O$ in the present embodiment projects from a side surface 209 of the body member 200 and is formed in a bent shape. A tip of the output terminal $24_O$ is inserted into the through-hole 37 of the control circuit unit 3. Further, the current sensor 88 is attached to the output terminal $24_O$.

The Sixteenth Embodiment has a configuration and operational effects similar to those in the first embodiment for other points.

(Seventeenth Embodiment)

Figure 32:
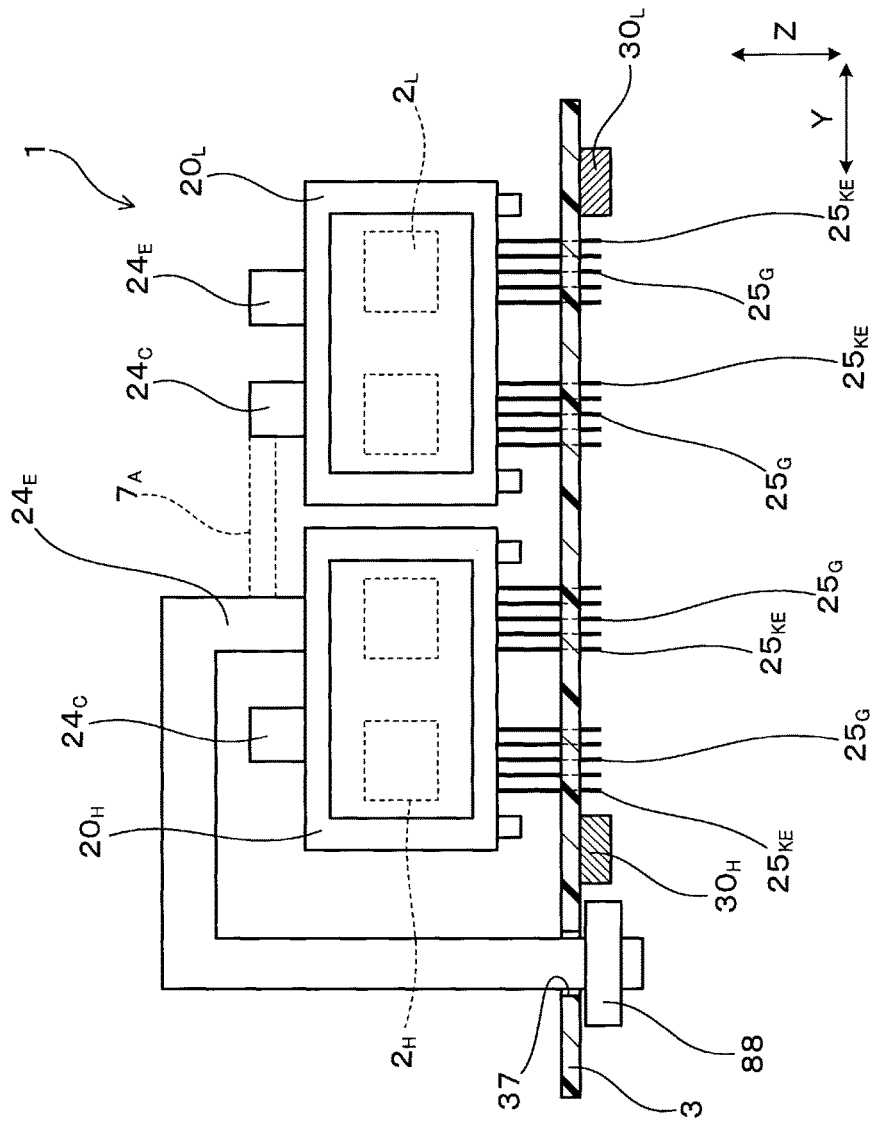
FIG. 32 is a schematic cross-section diagram of a power conversion apparatus in a seventeenth embodiment.

The present embodiment is an example in which the configuration of the semiconductor module 20 is changed. As illustrated in FIG. 32, in the present embodiment, the upper arm semiconductor element $2_H$ and the lower arm semiconductor element $2_L$ are respectively provided in different semiconductor modules 20. An emitter terminal $24_E$ of the upper arm semiconductor module $20_H$ and a collector terminal $24_C$ of the lower arm semiconductor module $20_L$ are connected to each other with the AC bus bar $7_A$. The emitter terminal $24_E$ of the upper arm semiconductor module is formed in a bent shape and inserted into the through-hole 37 of the control circuit unit 3. A current sensor 88 for measuring an output current is attached to the emitter terminal $24_E$.

The seventeenth embodiment has a configuration and operational effects similar to those in the first embodiment for other points.

(Eighteenth Embodiment)

Figure 33:
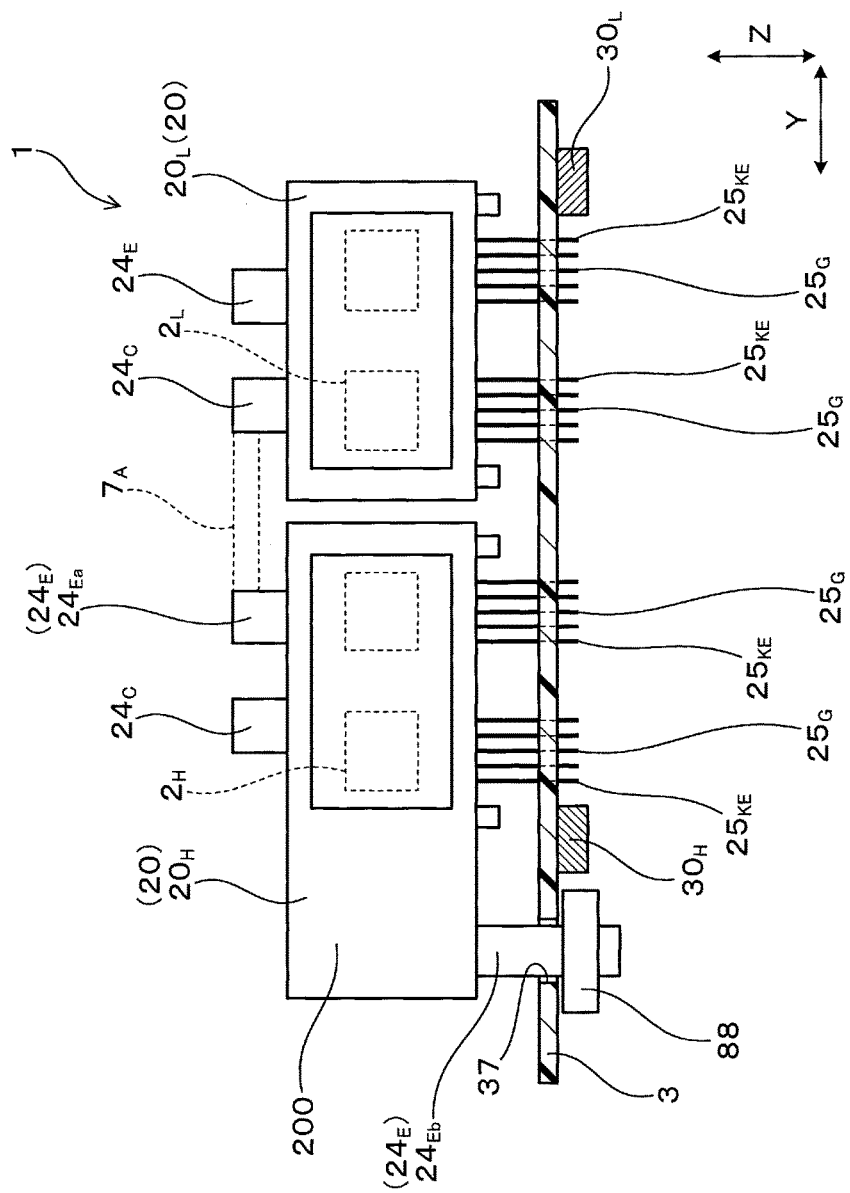
FIG. 33 is a schematic cross-section diagram of a power conversion apparatus in an eighteenth embodiment.

The present embodiment is an example in which the configuration of the semiconductor module 20 is changed. As illustrated in FIG. 33, in the present embodiment, the upper arm semiconductor element $2_H$ and the lower arm semiconductor element $2_L$ are respectively provided in different semiconductor modules 20. The upper arm semiconductor module $20_H$ includes two emitter terminals $24_E$ of a first emitter terminal $24_{Ea}$ and a second emitter terminal $24_{Eb}$. The above-described first emitter terminal $24_{Ea}$ is connected to the collector terminal $24_C$ of the lower arm semiconductor module $20_L$ with the AC bus bar $7_A$. The second emitter terminal $24_{Eb}$ projects from the body member 200 of the upper arm semiconductor module $20_H$ toward the control circuit unit 3 side in the Z direction. The second emitter terminal $24_{Eb}$ is inserted into the through-hole 37 of the control circuit unit 3. The current sensor 88 is attached to the second emitter terminal $24_{Eb}$.

The eighteenth embodiment has a configuration and operational effects similar to those in the first embodiment for other points.

(Nineteenth Embodiment)

Figure 34:
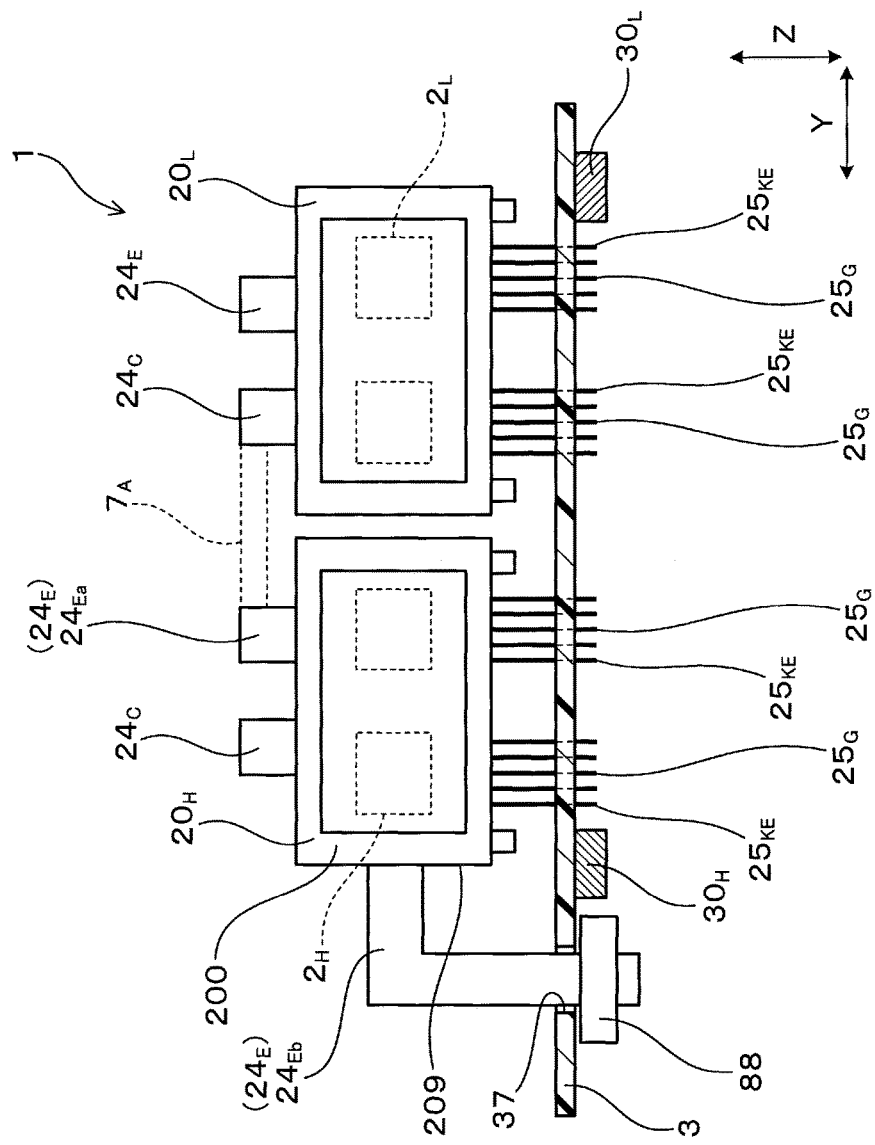
FIG. 34 is a schematic cross-section diagram of a power conversion apparatus in a nineteenth embodiment.

The present embodiment is an example in which the configuration of the semiconductor module 20 is changed. As illustrated in FIG. 34, in the present embodiment, the upper arm semiconductor element $2_H$ and the lower arm semiconductor element $2_L$ are respectively provided in different semiconductor modules 20. The first emitter terminal $24_{Ea}$ of the upper arm semiconductor module $20_H$ is connected to the collector terminal $24_C$ of the lower arm semiconductor module $20_L$ with the AC bus bar $7_A$. The second emitter terminal $24_{Eb}$ projects from the side surface 209 of the body member 200 of the upper arm semiconductor module $20_H$. The second emitter terminal $24_{Eb}$ is bent and inserted into the through-hole 37 of the control circuit unit 3. The current sensor 88 is attached to the second emitter terminal $24_{Eb}$.

The nineteenth embodiment has a configuration and operational effects similar to those in the first embodiment for other points.

(Twentieth Embodiment)

Figure 35:
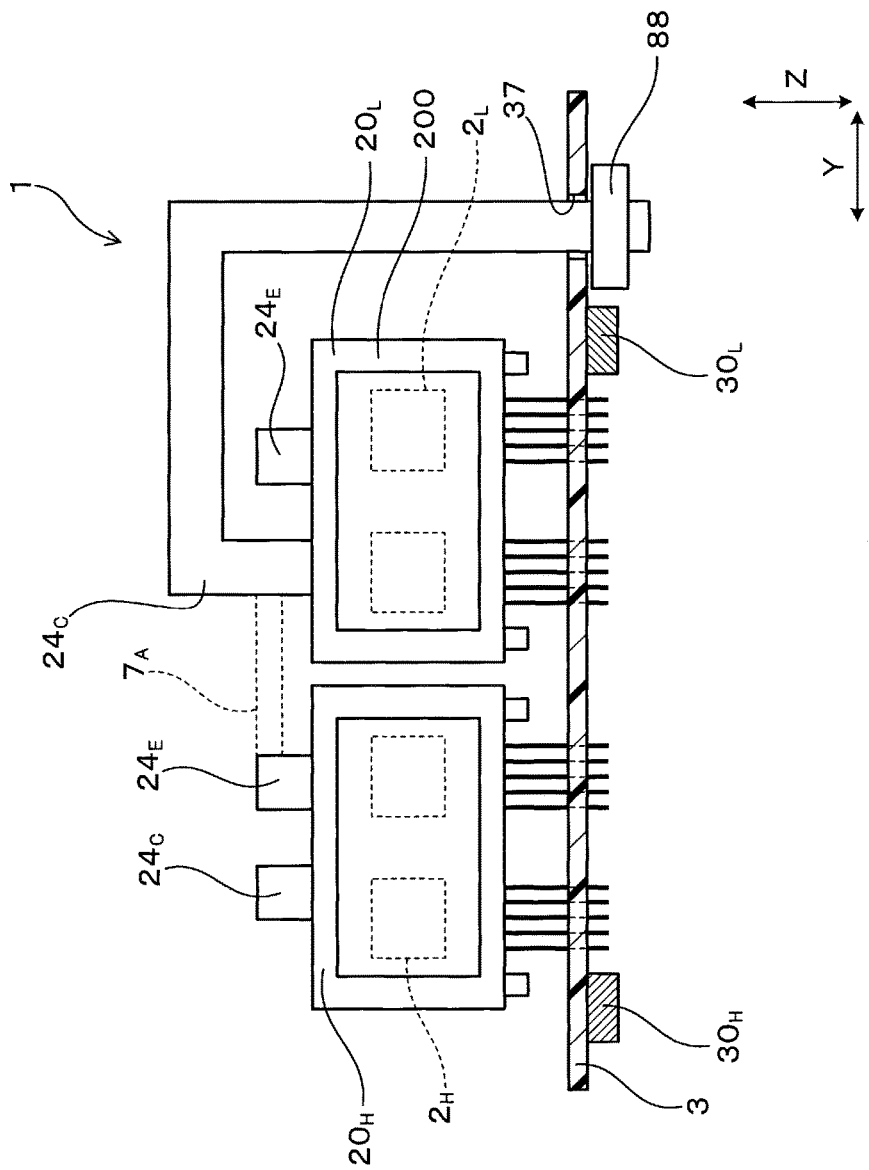
FIG. 35 is a schematic cross-section diagram of a power conversion apparatus in a twentieth embodiment.

The present embodiment is an example in which the configuration of the semiconductor module 20 is changed. As illustrated in FIG. 35, in the present embodiment, the upper arm semiconductor element $2_H$ and the lower arm semiconductor element $2_L$ are respectively provided in different semiconductor modules 20. The collector terminal $24_C$ of the lower arm semiconductor element $2_L$ projects from the body member 200 and is bent. The collector terminal $24_C$ is inserted into the through-hole 37 of the control circuit unit 3. The current sensor 88 is attached to the collector terminal $24_C$.

The twentieth embodiment has a configuration and operational effects similar to those in the first embodiment for other points.

(Twenty-first Embodiment)

Figure 36:
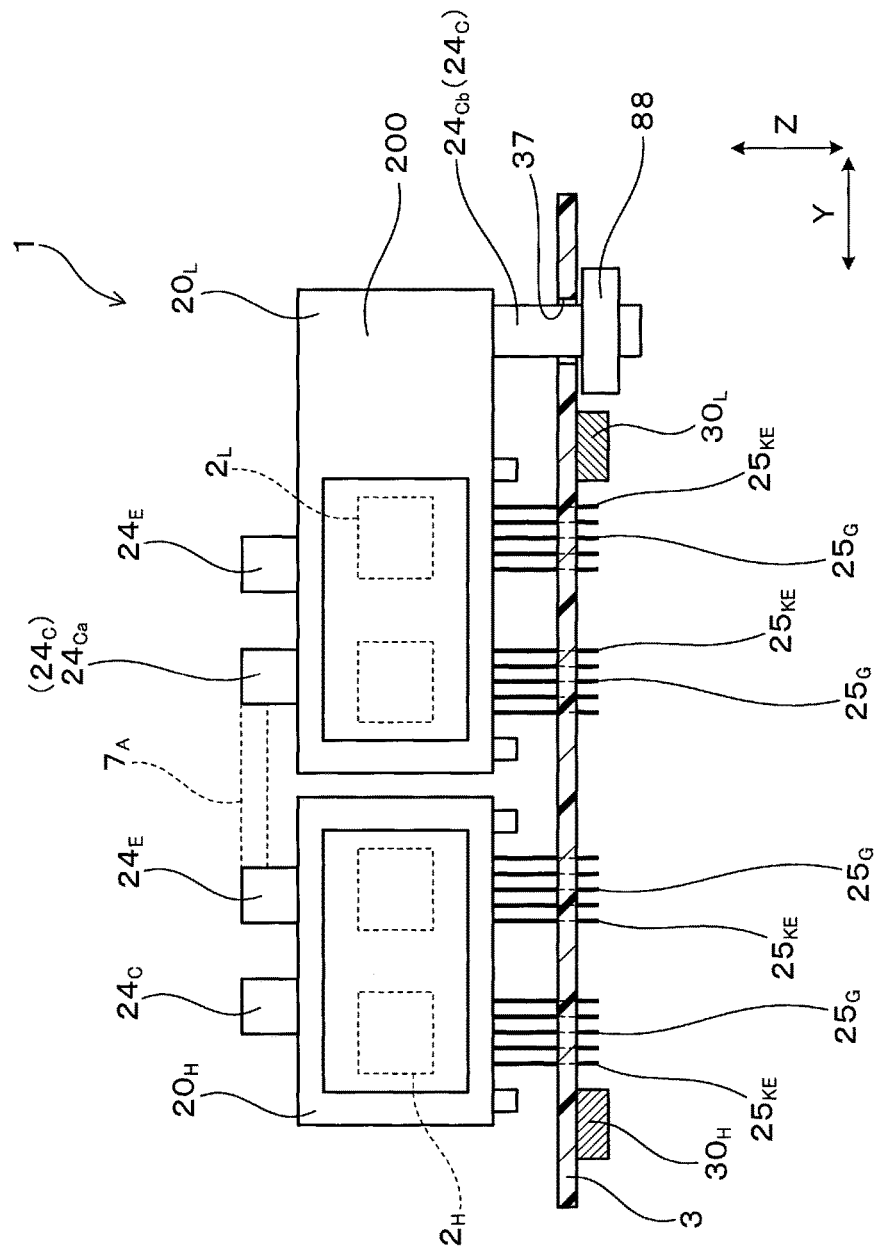
FIG. 36 is a schematic cross-section diagram of a power conversion apparatus in a twenty-first embodiment.

The present embodiment is an example in which the configuration of the semiconductor module 20 is changed. As illustrated in FIG. 36, in the present embodiment, the upper arm semiconductor element $2_H$ and the lower arm semiconductor element $2_L$ are respectively provided in different semiconductor modules 20. The lower arm semiconductor module $2_L$ includes two collector terminals $24_C$ of a first collector terminal $24_{Ca}$ and a second collector terminal $24_{Cb}$. The emitter terminal $24_E$ of the upper arm semiconductor module $20_H$ is connected to the first collector terminal $24_{Ca}$ of the lower arm semiconductor module $20_L$ with the AC bus bar $7_A$. The second collector terminal $24_{Cb}$ of the lower arm semiconductor module $20_L$ projects from the body member 200 toward the control circuit unit 3 side and is inserted into the through-hole 37. The current sensor 88 is attached to the second collector terminal $24_{Cb}$.

The twenty-first embodiment has a configuration and operational effects similar to those in the first embodiment for other points.

(Twenty-second Embodiment)

Figure 37:
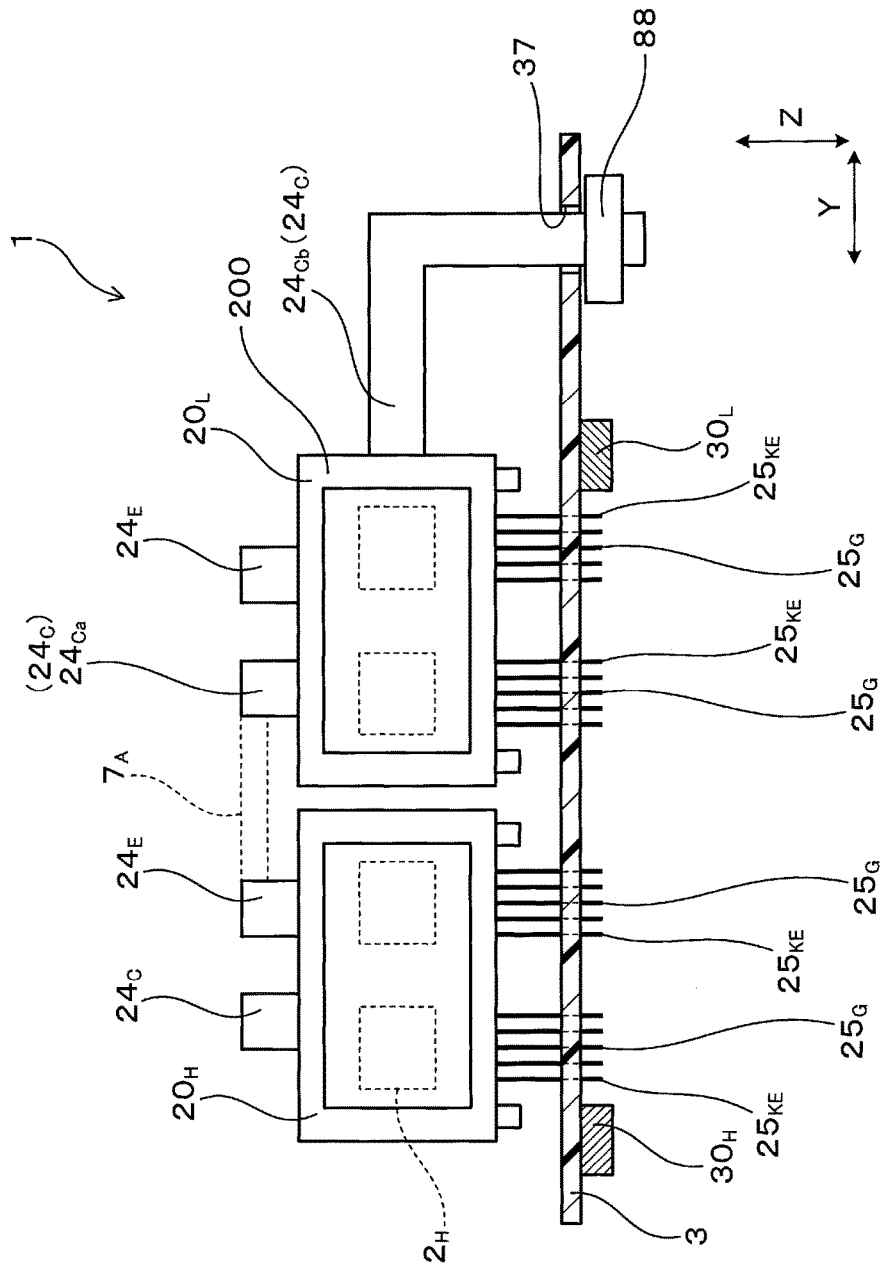
FIG. 37 is a schematic cross-section diagram of a power conversion apparatus in a twenty-second embodiment.

The present embodiment is an example in which the configuration of the semiconductor module 20 is changed. As illustrated in FIG. 37, the lower arm semiconductor module $20_L$ in the present embodiment includes two collector terminals $24_C$ of a first collector terminal $24_{Ca}$ and a second collector terminal $24_{Cb}$. The first collector terminal $24_{Ca}$ is connected to the emitter terminal $24_E$ of the upper arm semiconductor module $20_H$. The second collector terminal $24_{Cb}$ projects from the side surface 209 of the body member 200 and is formed in a bent shape. The second collector terminal $24_{Cb}$ is inserted into the through-hole 37 of the control circuit unit 3. The current sensor 88 is attached to the second collector terminal $24_{Cb}$.

The twenty-second embodiment has a configuration and operational effects similar to those in the first embodiment for other points.

(Twenty-third Embodiment)

Figure 38:
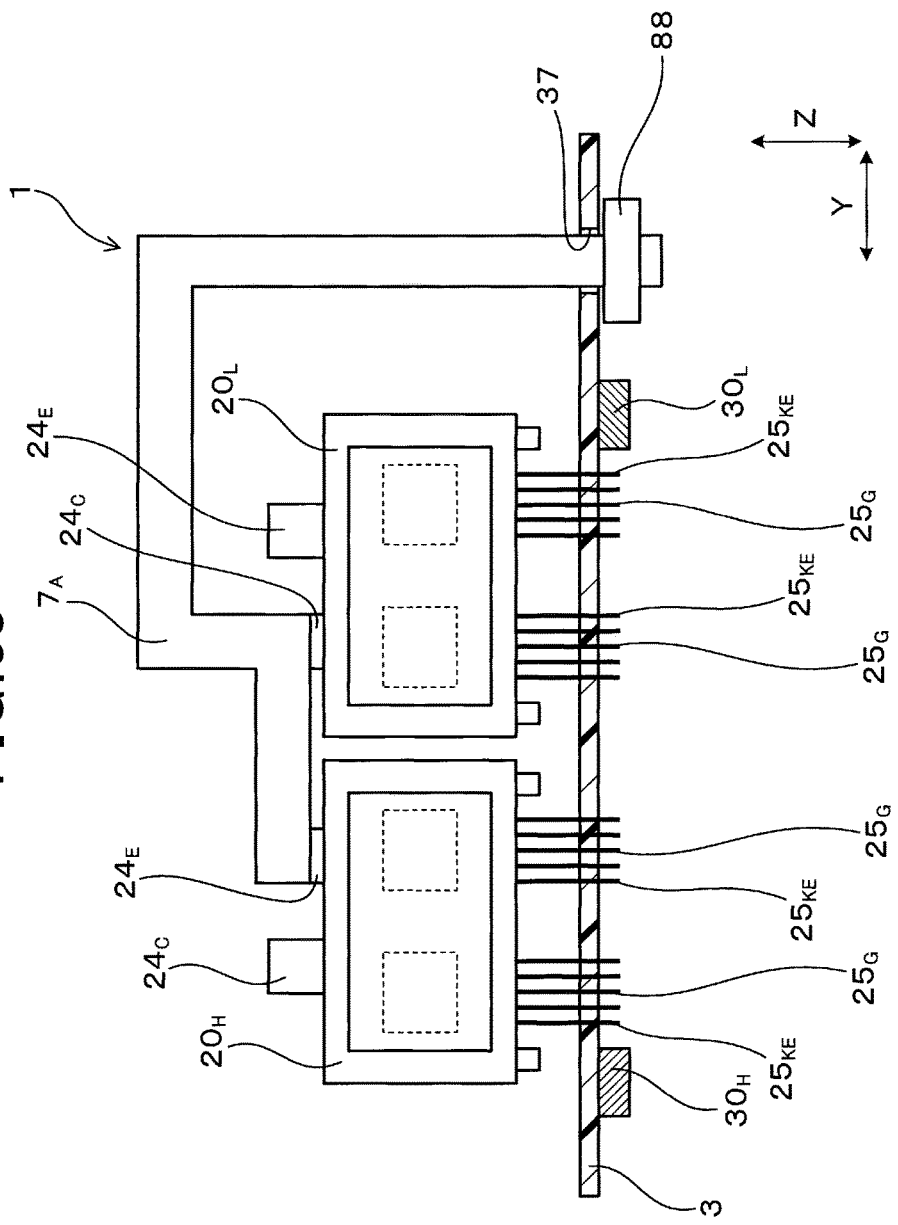
FIG. 38 is a schematic cross-section diagram of a power conversion apparatus in a twenty-third embodiment.

The present embodiment is an example in which a configuration of the AC bus bar $7_A$ is changed. As illustrated in FIG. 38, the AC bus bar $7_A$ in the present embodiment connects the emitter terminal $24_E$ of the upper arm semiconductor module $20_H$ to the collector terminal $24_C$ of the lower arm semiconductor module $20_L$. The AC bus bar $7_A$ is formed in a bent shape and inserted into the through-hole 37 of the control circuit unit 3. The current sensor 88 is attached to the AC bus bar $7_A$.

The twenty-third embodiment has a configuration and operational effects similar to those in the first embodiment for other points.

While the present disclosure has been described with reference to the examples, it should be understood that the present disclosure is not limited to the examples and structures. The present disclosure incorporates various modified examples and modifications within an equivalent range. In addition, various combinations, forms, and other combinations and forms including only one element or more or less elements also fall within the scope and the scope of mind of the present disclosure.

The invention claimed is:

1. A power conversion apparatus comprising:
   a plurality of semiconductor elements; and
   a control circuit unit configured to control switching of the plurality of semiconductor elements, wherein
   the plurality of semiconductor elements include upper arm semiconductor elements disposed on an upper arm side and lower arm semiconductor elements disposed on a lower arm side, a plurality of the upper arm semiconductor elements which are connected in parallel to each other are caused to perform switching at the same time, and a plurality of the lower arm semiconductor elements which are connected in parallel to each other are caused to perform switching at the same time, by the control circuit unit, the control circuit unit includes a drive circuit respectively electrically connected to the plurality of semiconductor elements which perform switching at the same time, control wirings which connect control electrodes of the plurality of semiconductor elements to the drive circuit, and reference wirings which connect reference electrodes of the plurality of semiconductor elements to the drive circuit, and a parasitic inductance in the reference wiring is made smaller than a parasitic inductance in the control wiring.

2. The power conversion apparatus according to claim 1, wherein a wiring length of the reference wiring is made shorter than a wiring length of the control wiring.

3. The power conversion apparatus according to claim 1, wherein a width of the reference wiring is made thicker than a width of the control wiring.

4. The power conversion apparatus according to claim 1, wherein a plurality of connecting members for electrically connecting the control circuit unit to the plurality semiconductor elements are formed at the control circuit unit, the drive circuit is formed at positions adjacent to connecting member groups configured with the plurality of connecting members in an arrangement direction of the plurality of connecting members, the connecting members include reference connecting members for electrically connecting to the reference electrodes of the semiconductor elements, and control connecting members for electrically connecting to the control electrodes, the reference connecting members are connected to the drive circuit with the reference wiring, the control connecting members are connected to the drive circuit with the control wiring, and the reference connecting members are formed at positions closer to the drive circuit connected to the reference connecting members and the control connecting members, than the control connecting members in the arrangement direction are.

5. The power conversion apparatus according to claim 4, wherein the connecting members formed at positions closest to the drive circuit in the arrangement direction among the plurality of connecting members are set as the reference connecting members.

6. The power conversion apparatus according to claim 4, wherein the connecting member groups include an upper arm connecting member group for connecting to the upper arm semiconductor elements and a lower arm connecting member group for connecting to the lower arm semiconductor elements, the drive circuits include an upper arm drive circuit connected to the upper arm semiconductor elements and a lower arm drive circuit connected to the lower arm semiconductor elements, and the upper arm drive circuit and the lower arm drive circuit are disposed between the upper arm connecting member group and the lower arm connecting member group in the arrangement direction.

7. The power conversion apparatus according to claim 6, wherein the plurality of connecting members constituting the connecting member group are respectively electrically connected to electrodes different from each other of the semiconductor elements, and connection order of individual connecting members constituting the upper arm connecting member group to the electrodes and connection order of individual connecting members constituting the lower arm connecting member group to the electrodes are reversed with respect to each other from one side toward the other side in the arrangement direction.

8. The power conversion apparatus according to claim 4, wherein the connecting member groups include an upper arm connecting member group for connecting to the upper arm semiconductor elements and a lower arm connecting member group for connecting to the lower arm semiconductor elements, the drive circuits include an upper arm drive circuit connected to the upper arm semiconductor elements and a lower arm drive circuit connected to the lower arm semiconductor elements, and the upper arm drive circuit, the upper arm connecting member group, the lower arm connecting member group, the lower arm drive circuit are disposed in this order in the arrangement direction.

9. The power conversion apparatus according to claim 4, wherein the semiconductor elements include a plurality of pads for electrically connecting to the control circuit unit, which are arranged in the arrangement direction, at least two pads among the plurality of pads are reference pads for electrically connecting the reference electrodes to the control circuit unit, and among a plurality of the reference pads, a reference pad disposed at a position closer to the drive circuit in the arrangement direction is electrically connected to the control circuit unit.

10. The power conversion apparatus according to claim 9, wherein among the plurality of pads, the reference pads are disposed at both ends in the arrangement direction.

11. The power conversion apparatus according to claim 4, wherein the power conversion apparatus includes two types of semiconductor modules of an upper arm semiconductor module in which the upper arm semiconductor elements are incorporated and a lower arm semiconductor module in which the lower arm semiconductor modules are incorporated, each of the semiconductor modules includes a body member in which the semiconductor elements are incorporated, and a plurality of control terminals projecting from the body member and connected to the connecting members, the upper arm semiconductor module and the lower arm semiconductor module are arranged in the arrangement direction, and the lower arm semiconductor module is connected to the control circuit unit in an attitude in which the upper arm semiconductor module is rotated by 180° around a rotation axis which is located between the two semiconductor modules and which is parallel to a projecting direction of the control terminals.

12. The power conversion apparatus according to claim 1, wherein
   the upper arm semiconductor elements and the lower arm semiconductor elements are incorporated into the same semiconductor module.

13. The power conversion apparatus according to claim 1, wherein
   the plurality of semiconductor elements which are connected in parallel to each other and which perform switching at the same time are incorporated into the same semiconductor module.

14. The power conversion apparatus according to claim 1, wherein
   a parasitic inductance in the reference wiring is made smaller than a parasitic inductance in the control wiring on only one of the upper arm side and the lower arm side.

15. The power conversion apparatus according to claim 1, wherein
   each of the plurality of semiconductor elements is individually connected to the control circuit unit by an independent wiring.

\* \* \* \* \*